United States Patent [19]

Tallon et al.

[11] Patent Number: 5,618,776
[45] Date of Patent: Apr. 8, 1997

[54] YTTRIUM OR RARE-EARTH SUBSTITUTED METAL OXIDE MATERIALS

[76] Inventors: Jeffrey L. Tallon, 3 Marine Drive, York Bay, Eastbourne; Robert G. Buckley, 145 Creswick Terrace, Northland, Wellington; Murray R. Presland, 4/1 Mahina Bay Road, Mahina Bay, Eastbourne, all of New Zealand

[21] Appl. No.: 324,456

[22] Filed: Oct. 17, 1994

Related U.S. Application Data

[63] Continuation of Ser. No. 129,800, Sep. 30, 1993, abandoned, which is a continuation of Ser. No. 706,592, May 28, 1991, abandoned, which is a division of Ser. No. 335,819, Apr. 10, 1989, abandoned.

[30] Foreign Application Priority Data

Apr. 8, 1988 [NZ] New Zealand ............................ 224205
Nov. 17, 1988 [NZ] New Zealand ............................ 226995
Feb. 24, 1989 [NZ] New Zealand ............................ 228132

[51] Int. Cl.$^6$ .......................... H01B 12/00; C04B 35/50; C04B 35/45
[52] U.S. Cl. .......................... 505/120; 505/121; 505/782; 505/783; 252/518; 252/521
[58] Field of Search .................... 505/100, 120, 505/121, 782, 783; 252/518, 521

[56] References Cited

U.S. PATENT DOCUMENTS

| | | | |
|---|---|---|---|
| 4,959,347 | 9/1990 | Kobayoshi | 505/782 |
| 5,019,553 | 5/1991 | Akimitsu | 505/1 |
| 5,061,681 | 10/1991 | Itozaki | 505/1 |
| 5,070,070 | 12/1991 | Askew | 505/782 |
| 5,126,316 | 6/1992 | Sleight | 505/782 |
| 5,389,603 | 2/1995 | Batlogg et al. | 505/782 |

OTHER PUBLICATIONS

Fukushima "Electrical and Magnetic Properties in $Bi_2Sr_2Ca_{1-x}Y_xCu_2O$". Jap. J. Appl. Phys. v. 27(8) Aug. 1988 pp. L1432–L1434.

A. Manthiram and J.B. Goodenough, "Vanishing of Superconductivity at a Transition From Itinerant–Electron to Small–Polaron Conduction in Nominal $Bi_{4-x}Pb_x(Sr_3Ca)Ca_{2-x}Y_xCu_4O_{16}$", Appl. Phys. Lett. 53(26) (26 Dec. 1988).

A. Manthiram and J.B. Goodenough, "Dependence of $T_c$ on Hole Concentration in the Superconductors $Bi_4Sr_3Ca_{3-x}Y_xCu_4O_{16+\delta}$", Appl. Phys. Lett. (53(5) (1 Aug. 1988).

(List continued on next page.)

Primary Examiner—Paul Lieberman
Assistant Examiner—M. Kopec
Attorney, Agent, or Firm—Dann, Dorfman, Herrell and Skillman, P.C.

[57] ABSTRACT

The invention provides certain novel metal oxide materials which exhibit superconductivity at elevated temperatures and/or which are useful in electrode, electrolyte, cell and sensor applications, or as electrochemical catalysts. The metal oxide materials are generally within the formula $$R_{n+1-u-s}A_u M_{m+e} Cu_n O_w \quad (1)$$

where $n \geq 0$ and n is an integer or a non-integer, $1 \leq m \leq 2$, $0 \leq s \leq 0.4$, $0 \leq e \leq 4$, and $2n+(\frac{1}{2}) < w < (5/2)n+4$, with the provisos that u is 2 for $n \geq 1$, u is n+1 for $0 \leq n < 1$ and where R and A are each any of or any combination of Y, La, Ce, Pr, Nd, Sm, Eu, Gd, Dy, Ho, Er, Tm, Yb, Lu, Ca, Sr, Ba, Li, Na, K, Rb or Cs; M is any of or any combination of Cu, Bi, Sb, Pb, Tl or any other transition metal; Cu is Cu or Cu partially substituted by any of or any combination of Bi, Sb, Pb, Tl or any other transition metal; O is O or O partially substituted by any of N, P, S, Se, or F; and wherein the structure of the materials is characterized by distorted or undistorted substantially square planar sheets of $CuO_2$ when $n>0$ and distorted or undistorted substantially square sheets of R for $n>1$.

18 Claims, 18 Drawing Sheets

OTHER PUBLICATIONS

Fukushima, et al., "Transition to an Insulator from a Superconductor Due to Substitution of Ca by Rare–Earth Elements in $Bi_4Sr_4RE_2Cu_4O_{16+\delta}$(RE=Nd, Eu, Y)", *Japanese Journal of Applied Physics,* vol. 27, No. 5 (May, 1988).

Tamegai, et al., "Characterization of a Non–Superconducting Cuprate, $Bi_2Sr_2YCu_2O_{8.5}$", *Japanese Journal of Applied Physics,* vol. 27, No. 6 (Jun. 1988).

R. Yoshizaki, et al., "Superconducting and magnetic Properties of $Bi_2SR_2Ca_{1-x}Y_xCu_2O_{y \leq x \leq 1}$", *Physica C 152,* (1988).

Ando "Study on Normal and Superconducting Properties at $Bi_4Sr_3(Ca_{1-x}Y_x)_3Cu_4O_x$" *Solid State Comm* v. 67(8) 1988 pp. 815–819.

Groen "A Study of $Bi_2Sr_{2-x}Ca_xCaO_{6+\delta}$ with X–ray . . ." *Solid State Comm* v. 68(6) 1988 pp. 527–529.

Tai et al "Bulk Superconductivity in the New Orthorhombic (Tl,Pl)–Ca–Sr–Cu–O System" Jap. Journ. of App. Physics, No. 12, Dec. 1988 pp. L2287–L2288.

Lin et al "A New High–Tc Superconducting Tl–Pb–Ca–Sr–Cu–O System" Physica C, vol. 156, 1988 pp. 791–794.

Ganguli et al "Superconductivity in Bi–Ca–Y–Sr–CuO (2122) & Tl–Ca–Y–Ba–Cu–O . . . " Mat. Res. Bull., vol. 24, pp. 103–109, Jan. 1989.

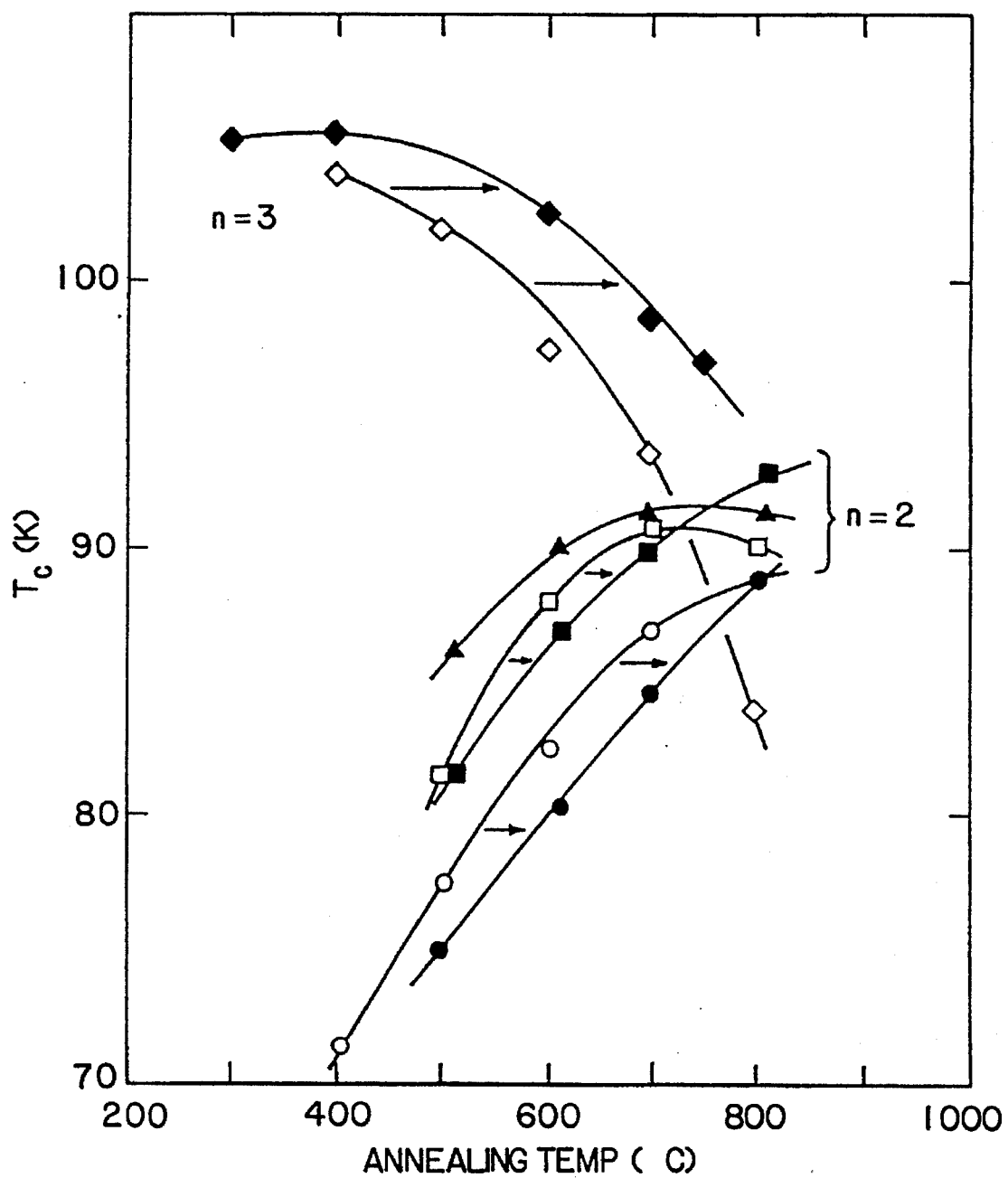
F I G. 10

YTTRIUM OR RARE-EARTH SUBSTITUTED METAL OXIDE MATERIALS

This application is a continuation of U.S. Ser. No. 08/129,800, filed Sep. 30, 1993, now abandoned, which is a continuation of U.S. Ser. No. 07/706,592, filed May 28, 1991, now abandoned, which is a division of U.S. Ser. No. 07/335,819, filed Apr. 10, 1989 now abandoned.

The invention comprises certain novel metal oxide materials which exhibit superconductivity at elevated temperatures and/or which are useful as electrodes or electrolytes in electrochemical cells, sensors, and as catalysts.

It is known that certain classes of metal oxide will exhibit the phenomenon of superconductivity below a particular critical temperature referred to as $T_c$. These include as prototypes $BaPb_{2-x}Bi_xO_{3-d}$, $Ba_{2-x}Sr_xCuO_{4-d}$, $YBa_2Cu_3O_{7-d}$ as described in The Chemistry of High Temperature Superconductors, ed. by Nelson et al, American Chem. Soc. 1987, and $Bi_2Sr_2CaCu_3O_{5-d}$ as described by Subramanian et al, Science 239, 1015 (1988). We have identified this last material as the n=2 member in a homologous series of approximate formula $Bi_2(Sr,Ca)_{n+1}Cu_nO_{2n+4+d}$, n=0,1,2,3, . . . , obtained by inserting an additional layer of Ca and an additional square planar layer of $CuO_2$ in order to obtain each higher member. These materials often exhibit intergrowth structures deriving from a number of these homologues as well as Bi substitution on the Sr and Ca sites. $T_c$ is observed to rise as n increases from 1 to 2 to 3. The material $YBa_2Cu_4O_{8+d}$ has a layered structure similar to the n=2 member of this series $Bi_2Sr_2CaCu_2O_{8+d}$ and we expect therefore that $YBa_2Cu_4O_{8-d}$ belongs to similar series. One such series could be obtained by insertion of extra $Y-CuO_2$ layers resulting in the series of materials $R_nBa_2Cu_{n+3}O_{3.5+2.5n-d}$, n=1,2,3, . . . and another by insertion of extra $Ca-CuO_2$ layers resulting in the series $RBa_2Ca_nCu_{n+4}O_{8+2n-d}$, n=1,2, . . . By analogy it may be expected that $T_c$ in these two series should rise with the value of n.

Binary, ternary or higher metal oxide materials containing as cations one or more alkali earth elements, such as these materials and having high oxygen-ion mobility may also be used as electrodes, electrolytes and sensors for electrochemical applications. The oxygen-ions will move through such an electrolyte material under an applied electrical field allowing the construction of oxygen pumps for catalysis and other oxidising or reduction processes involving the supply or extraction of atomic oxygen. The oxygen-ions will also move through such an electrolyte material under a concentration gradient allowing the construction of batteries, fuel cells and oxygen monitors. For these materials to act effectively as electrolytes in such applications it is necessary that they have high oxygen-ion mobility through the atomic structure of the materials and at the same time have a low electronic conductivity so that the dominant current flow is by oxygen-ions and not electrons. For these materials to act effectively as electrodes in such applications it is necessary that they have a high electronic conductivity as well as a high oxygen-ion mobility so that electrons which are the current carried in the external circuit may couple to oxygen-ions which are the current carrier in the internal circuit. Electrochemical cells including fuel cells, batteries, electrolysis cells, oxygen pumps, oxidation catalysts and sensors are described in "Superionic Solids" by S. Chandra (North Holland, Amsterdam 1981).

Solid electrolytes, otherwise known as fast-ion conductors or superionic conductors have self diffusion coefficients for one species of ion contained within their crystalline structure ranging from $10^{-7}$ to $10^{-5}$ cm$^2$/sec. A diffusion coefficient of about $10^{-5}$ m$^2$/sec is comparable to that of the ions in a molten salt and thus represents the upper limit for ion mobility in a solid and is tantamount to the sublattice of that particular ion being molten within the rigid sublattice of the other ions present. Such high diffusion mobilities translate to electrical conductivities ranging from $10^{-2}$ to 1 S/cm, the latter limit corresponding to that commonly found in molten salts. The n=0 member of the series $Bi_{2+e-x}Pb_x(Sr,Ca)_{n+1-s}Cu_nO_{2n+4+d}$ and various substituted derivatives are identified as solid electrolytes with high oxygen-ion mobility. The n=1,2 and 3 members of the series may have high oxygen-ion mobility as well as high electron conductivity and thus are potentially applicable as electrode materials.

The invention provides certain novel metal oxide materials which exhibit superconductivity at low temperatures and/or which are useful in such electrode, electrolyte, cell and sensor applications, or as electrochemical catalysts.

In broad terms the invention comprises metal oxide materials within the formula $$R_{n+1-u-s}A_uM_{m+e}Cu_nO_w \quad (1)$$

where n≧0 and n is an integer or a non-integer, 1≦m≦2, 0≦s≦0.4, 0≦e≦4, and 2n+(½)≦w≦(5/2)n+4, with the provisos that u is 2 for n≧1, u is n+1 for 0≦n<1
and where R and A are each any of or any combination of Y, La, Ce, Pr, Nd, Sm, Eu, Gd, Dy, Ho, Er, Tm, Yb, Lu, Ca, Sr, Ba, Li, Na, K, Rb or Cs, M is any of or any combination of Cu, Bi, Sb, Pb, Tl or any other transition metal, Cu is Cu or Cu partially substituted by any of or any combination of Bi, Sb, Pb, Tl or any other transition metal, O is O or O partially substituted by any of N, Se, or F, and wherein the structure of the materials is characterized by distorted or undistorted substantially square planar sheets of $CuO_2$ when n>0 and distorted or undistorted substantially square sheets of R for n>1.

excluding where M is Bi, R is Ca and Sr, A is Sr and Ca, and s and e are 0 and where n=1, the material $Bi_2(Sr_{1-x}Ca_x)_2CUO_{8-d}$ with 0≦x≦0.3, and where n=2 the material $Bi_2(Sr_{1-x}Ca_x)_3Cu_2O_{10-d}$ with 0.16≦x≦0.33
and excluding $RBa_2Cu_3O_{7-d}$
and excluding, where R is as above excluding Ca, Sr, Ba, Li, Na, K, Rb or Cs, the material having formula $$RBa_2Cu_4O_{8-d}.$$

The n=1,2,3,4,5, . . . materials have pseudo-tetragonal structures with lattice parameters a, b and c given by 5.3 Å≦a,b≦5.5 Å and c=18.3±v+(6.3±v')n Å where 0≦v, v'≦0.3. The n=0 material extends over the solubility range 0≦e≦4 and has orthorhombic or rhombohedral symmetry with lattice parameter c=19.1±v Å.

Preferred materials of the invention are those of formula (1) wherein m is 2 and R is Ca and R is predominantly Bi and having the formula $$Bi_{2+e-x}L_xCa_{n+1-u-s}A_uCu_nO_w \quad (2)$$

where L is any of or any combination of Pb, Sb, or Tl, and 0<x<0.4.

More preferred materials of the invention are those of formula (2) where n≧1 and 0≦e≦0.4 and having the formula $$Bi_{2+e-x}L_xCa_{n+y-1-s}Sr_{2-y}A_zCu_nO_{2n+4+d} \quad (3)$$

and where 0≦z≦0.4, −2≦y≦2, and −1≦d≦1.

Materials of formula (3) of the invention wherein n is 3 have the formula $$Bi_{2+e-x}L_xCa_{2+y-s}Sr_{2-y}A_zCu_3O_{10+d}. \quad (4)$$

Preferably in the n=3 materials of formula (4) L is Pb and $0 \leq x \leq 0.4$ and $-1 \leq y,d \leq 1$. A may preferably be Y or Na and $0 \leq z \leq 0.4$ and preferably O, with preferably $0.5 \leq y 0.5$ and $-1 \leq d \leq 1$. Preferably d is fixed in a range determined by annealing in air at between 300° C. and 550° C., or by annealing in an atmosphere at an oxygen pressure or partial pressure and temperature equivalent to annealing in air at between 300° C. and 550° C. Most preferably $0.2 \leq e,s \leq 0.3$, $0.3 \leq x 0.4$ and $-0.1 \leq y \leq 0.1$.

Especially preferred n=3 materials of the invention are $Bi_{1.9}Pb_{0.35}Ca_2Sr_2Cu_3O_{10+d}$, $Bi_{2.1}Ca_2Sr_2Cu_3O_{10+d}$, preferably wherein d is fixed in a range determined by annealing in air at between 300° C. and 550° C., or by annealing in an atmosphere at any oxygen pressure or partial pressure and temperature equivalent to annealing in air at between 300° C. and 550° C.

Materials of formula (3) of the invention wherein n is 2 have the formula $$Bi_{2+e-x}L_xCa_{1+y-s}Sr_{2-y}A_zCu_2O_{8+d} \quad (5)$$

where $-1 \leq d \leq 1$.

Preferably in the n=2 materials of formula (5) L is Pb and $0 \leq x$ and most preferably $0 \leq x \leq 0.4$, z is 0, and $-1 \leq y,d \leq 1$. A may preferably be Y or Na; where A is Y preferably $0 \leq z \leq 0.4$ and most preferably $0 \leq z \leq 0.1$ and where A is Na preferably $0 \leq z \leq 0.4$, x is 0, and $-1 \leq y,d \leq 1$; in both cases preferably d is fixed in a range determined by annealing in air at between 700° C. and 830° C. or in 2% oxygen at between 600° C. and 800° C., or by annealing in an atmosphere at an oxygen pressure or partial pressure and temperature equivalent to annealing in air at between 700° C. and 800° C.

A preferred n=2 material is that of formula (5) wherein L is Pb, and where $0 \leq x \leq 0.4$, z is 0, $0 \leq e,s \leq 0.25$, y is −0.5, and d is fixed in a range determined by annealing the material in air between 600° C. and 800° C., or by annealing in an atmosphere at an oxygen pressure or partial pressure and temperature equivalent to annealing in air at between 700° C. and 800° C.

A further preferred n=2 material is that of formula (5) wherein L is Pb, and where $0 \leq x \leq 0.4$, z is 0, $0 \leq e,s \leq 0.25$, y is 0, and d is fixed in a range determined by annealing in air at between 700° C. and 830° C. or in 2% oxygen at between 600° C. and 800° C. or by annealing in an atmosphere and at an oxygen pressure or partial pressure and temperature equivalent to annealing in air at between 700° C. and 830° C.

A further preferred n=2 material is that of formula (5) wherein L is Pb, and where $0 \leq e,s \leq 0.25$, $0 \leq x 0.4$, y is 0.5, z is 0, and d is fixed in a range determined by annealing in air at between 450° C. and 700° C. or by annealing in an atmosphere at an oxygen pressure or partial pressure and temperature equivalent to annealing in air at between 450° C. and 700° C.

A further preferred n=2 material is that of formula (5) having the formula $Bi_{2.1+e}Pb_{0.2}Ca_{1-s}Sr_2Cu_2O_{8+d}$ and where $0 \leq e,s \leq 0.2$ and d is fixed in a range determined by annealing in 2% oxygen at between 770° C. and 830° C. or in an atmosphere at an oxygen pressure or partial pressure and temperature equivalent to annealing in 2% oxygen at between 770° C. and 830° C.

A further preferred n=2 material is that of formula (5) having the formula $Bi_{2+e}Ca_{1+y-s}Sr_{2-y}Cu_2O_{8+d}$ where $-0.5 \leq y \leq 0.5$ and $0 < e,s \leq 0.25$ and most preferably wherein y is −0.5 or most preferably O, and d is fixed in a range determined by annealing in air at between 600° C. and 800° C. or by annealing in an atmosphere at an oxygen partial pressure and temperature equivalent to annealing in air at between 600° C. and 800° C.; of the above formula or wherein y is 0.5, and d is fixed in a range determined by annealing the material in air at between 450° C. and 700° C. or in an atmosphere other than air at an oxygen pressure or partial pressure and temperature equivalent to annealing in air at between 450° C. and 700° C.

Materials of formula (1) of the invention wherein n is 1 have the formula $$Bi_{2+e-x}L_xCa_{y-s}Sr_{2-y}A_zCuO_{6+d} \quad (6)$$

where $0 \leq y \leq 1$ and $-1 \leq d \leq 1$

Preferably in the n=1 materials of formula (6) L is Pb and $0 \leq x \leq 0.4$. A is preferably Na and $0 < z \leq 0.4$.

A preferred n=1 material is that of formula (6) wherein L is Pb, and where $0 < x \leq 0.4$, $0 \leq e,s \leq 0.25$ y is 0.7, and z is 0.

A further preferred n=1 material is that of formula (6) wherein L is Pb, and where $0 \leq e,s \leq 0.25$, $0 \leq x \leq 0.4$, y is 1 and z is 0.

A further preferred n=1 material is that of formula (6) wherein L is Pb, and where z is 0, $0 \leq e,s \leq 0.25$ $0.3 \leq x \leq 0.4$, and $0.5 \leq y \leq 0.7$.

A preferred n=1 material is $$Bi_{1.85}Pb_{0.35}Ca_{0.4}Sr_{1.4}CuO_{6+d}.$$

A preferred n=1 material is $Bi_{2+e}Ca_{y-s}Sr_{2-y}CuO_{6+d}$ where $0 < e,s \leq 0.25$ and y is 1 and d is fixed in a range determined by annealing in air at between 300° C. and 500° C. or by annealing in an atmosphere at an oxygen pressure or partial pressure and temperature equivalent to annealing in air at between 300° C. and 500° C.

A further preferred n=1 material is that of formula (6) where y is 0.67, and d is fixed in a range determined by annealing in air at between 400° C. and 600° C. or by annealing in an atmosphere at an oxygen pressure or partial pressure and temperature equivalent to annealing in air at between 400° C. and 600° C.

Materials of formula (1) of the invention where n is 0 have the formula $$Bi_{2+e-x}L_xA_{1-z}A'_zO_w \quad (7)$$

where $0 \leq x \leq 0.4$ and $0 \leq z \leq 1$ with the proviso that z is not 0 when x is 0, and where $0 \leq e \leq 4$.

Preferably in the n=0 materials of formula (7) wherein L is Pb and preferably A is Ca, Sr, or Ba or any combination thereof. Where A is Ca preferably A' is Sr, Ba, Na or Y, or any combination thereof. Where A is Sr preferably A' is Ba, Na or K, or any combination thereof. Most preferably A is Ba and A' is K.

Specific materials of the invention include
$Bi_{2+e}SR_{0.8}Na_{0.2}O_{4+d}$, $Bi_{2+e}Ba_{0.5}K_{0.2}O_{4+d}$,
$Bi_{2+e}Ca_{0.5}Sr_{0.5}O_{4+d}$, $Bi_{2+e}Ba_{0.5}Sr_{0.5}O_{4+d}$,
$Bi_{1.9+e}Pb_{0.1}SrO_{4+d}$, and $Bi_{1.9+e}Pb_{0.1}BaO_{4+d}$, with $0 \leq e \leq 4$ and $3 \leq d \leq 10$.

The invention encompasses materials of formula (7) wherein $n \geq 2$, s=0 and M is Cu or Cu substituted by any of or any combination of Bi, Sb, Pb, Tl or any other transition metal, and having the formula $$R_{n-1}A_2Cu_mCu_nO_w \quad (8)$$

Preferably in materials of formula (8) of the invention A is Ba, m is 1 or 2, and n is 3, 4, ... A material of this class may be where m=3/2 and n=2, and having the formula $$RBa_2Cu_{3.5}O_{7+d}$$

where $-0.5 \leq d \leq 0.5$, and where R is Y.

The invention encompasses a material having the formula $$Y_{n-1}Ba_2Cu_{n+1}O_{(5/2)n+3/2+d}$$

where $-1 \leq d \leq 1$ and n is 3,4,5, . . . , a material having the formula $$Y_{n-1}Ba_2Cu_{n+2}O_{(5/2)n+5/2+d},\ \text{and,}$$

a material having the formula $$RBa_2Ca_{n-2}Cu_{n+2}O_{(5/2)n+5/2+d}$$

wherein n is 3,4,5, . . . preferably where R is Y.

The materials of the invention may be formed as mixed phase or intergrowth structures incorporating structural sequences from a number of the above described materials also including sequences from the material $RBa_2Cu_3O_{7-d}$ and its derivatives. For example, this includes $RBa_2Cu_{3.5}O_{7.5-d}$ comprising, as it does, approximately alternating sequences of $RBa_2Cu_3O_{7-d}$ and $RBa_2Cu_4O_{8-d}$. This also includes materials with general formula (1) with n taking non-integral values allowing for the fact that, for example, a predominantly n=2 material may have n=1 and n=3 intergrowths. This also includes materials with general formula (1) with n taking non-integral values allowing for ordered mixed sequences of cells of different n values, for example, n=2.5 for alternating sequences of n=2 and n=3 slabs.

Typically, the materials of the invention may be prepared by solid state reaction of precursor materials such as metals, oxides, carbonates, nitrates, hydroxides, or any organic salt or organo-metallic material, for example, such as $Bi_2O_3$, $Pb(NO_3)_2$, $Sr(NO_3)_2$, $Ca(NO_3)_2$ and CuO for BiPbSrCaCuO materials. The materials of the invention may also be prepared by liquid flux reaction or vapour phase deposition techniques for example, as will be known to those in the art. Following forming of the materials oxygen loading or unloading as appropriate to achieve the optimum oxygen stoichiometry, for example for superconductivity, is carried out. The above preparation techniques are described in "Chemistry of High Temperature Superconductors"—Eds. D. L. Nelson, M. S. Whittingham and T. F. George, American Chemical Society Symposium Series 351 (1987); Buckley et al, Physica C156, 629 (1988); and Torardi et al Science 240, 631 (1988), for example. The materials may be prepared in the form of any sintered ceramic, recrystallised glass, thick film, thin film, filaments or single crystals.

In order to achieve maximum strength and toughness for the materials, it is important that they are prepared to a density close to the theoretical density. As prepared by common solid-state reaction and sintering techniques, densities of about 80% theoretical density can readily be achieved. Higher densities may be achieved by, for example, spray drying or freeze drying powders as described for example in Johnson et al, Advanced Ceramic Materials 2, 337 (1987), spray pyrolysis as described for example in Kodas et al, Applied Physics Letters 52, 1622 (1988), precipitation or sol gel methods as described for example in Barboux et al J. Applied Physics 63, 2725 (1988), in order to achieve very fine particles of dimension 20 to 100 mm. After die-pressing these will sinter to high density. Alternatively, to achieve higher densities one may hot press, extrude, or rapidly solidify the ceramic material from the melt after solid state reaction or grow single crystals.

Preparation of the materials of the invention may be carried out more rapidly if in preparation of the materials by solid state reaction of precursor material any or all of the cations in the end material are introduced as precursors in the nitrate or hydroxide forms for rapid reaction of bulk material in the nitrate or hydroxide melt. Both the temperature and duration of the preparation reaction may be lowered by using nitrate or hydroxide precursors to introduce the cations. Melting of the nitrate and/or hydroxide precursors allows intimate atomic mixing prior to decomposition and efflux of oxides of nitrogen.

After preparation the materials may be sintered or (re)ground to small particles and pressed to shape and sintered as desired to form the end material for use, as is known in the art and/or annealed to relieve stresses and increase strength and toughness as is similarly known in the art for the unsubstituted materials. The materials after preparation may as necessary be loaded on unloaded with oxygen to achieve the optimum stoichiometry for superconductivity, optimised oxygen mobility, or other material properties. As stated, for n=2 BCSO materials for example this generally requires oxygen unloading into the materials and with known technique this is generally carried out by annealing at 700° C. to 830° C. in air over 1 to 4 hours followed by rapid quenching into liquid nitrogen, for example. Most suitably, oxygen loading or unloading is carried out during cooling from the reaction temperatures immediately after the preparation reaction, where the materials are prepared by solid state reaction for example. Alternatively and/or additionally oxygen loading may be carried out during sintering or annealing in an oxygen containing atmosphere at an appropriate pressure or partial pressure of oxygen. Without loss of generality the materials may be annealed, cooled, quenched or subjected to any general heat treatment incorporating AgO or $Ag_2O$ as oxidants or in controlled gaseous atmospheres such as argon, air or oxygen followed by rapid quenching so as to control the oxygen stoichiometry of the novel materials, the said stoichiometry being described by the variables w or d. The materials may be used as prepared without necessarily requiring oxygen loading or unloading for forming electrodes, electrolytes, sensors, catalysts and the like utilising high oxygen mobility property of the materials.

The invention is further described with reference to the following examples which further illustrate the preparation of materials in accordance with the invention. In the drawings which are referred to in the examples:

FIG. 1 shows a graph of electrical conductivity as a function of inverse temperature. Open circles are for heating and closed circles are for cooling when measurements are made at 1592 Hz. The triangles refer to the equivalent conductivity for the mid-frequency relaxation peak (upward pointing triangles) and the high-frequency peak (downward pointing). Open triangles and the circles refer to $Bi_2SrO_4$ and the full triangles refer to $Bi_2Sr_{0.9}Na_{0.1}O_4$.

Figure 6A:
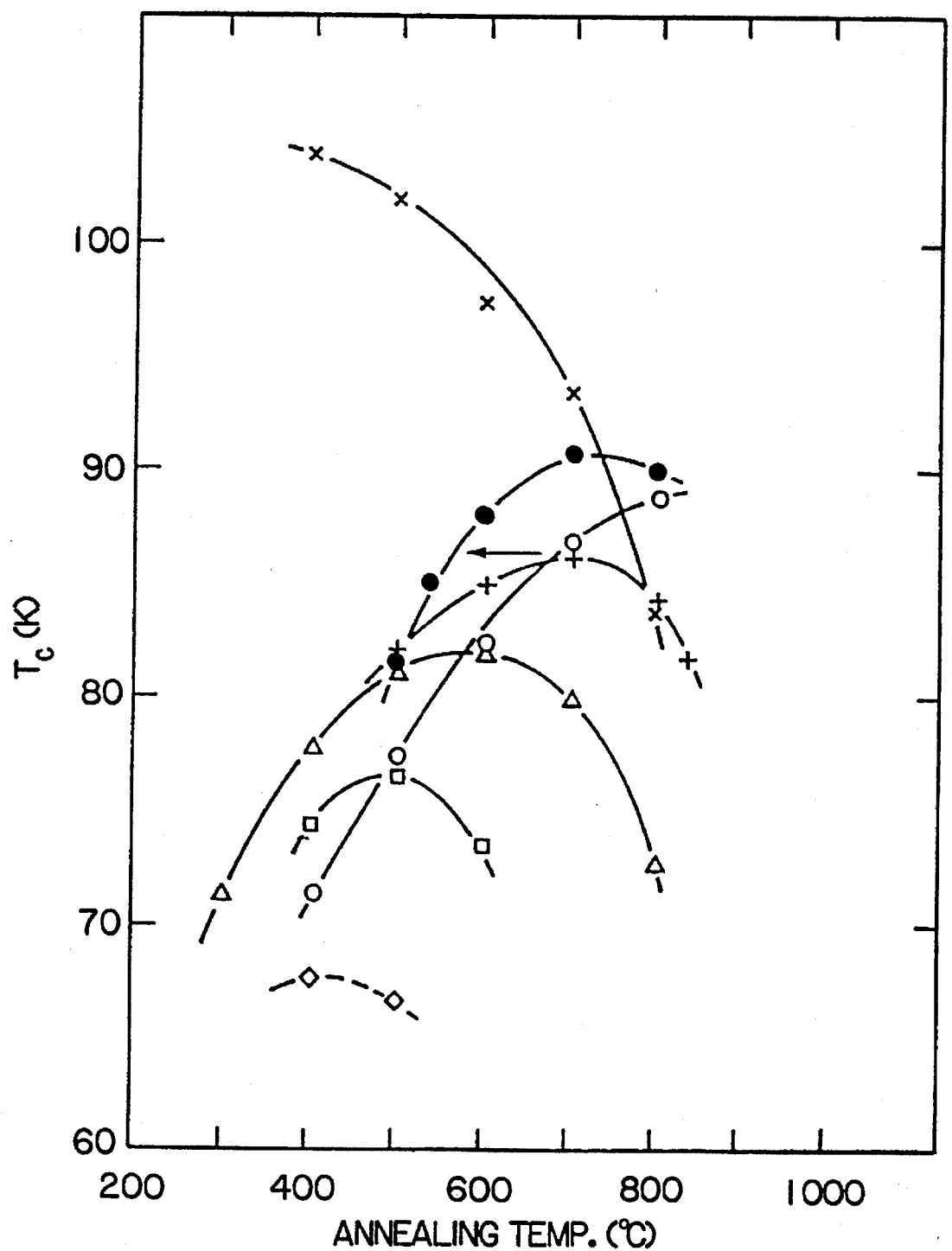
Figure 6B:
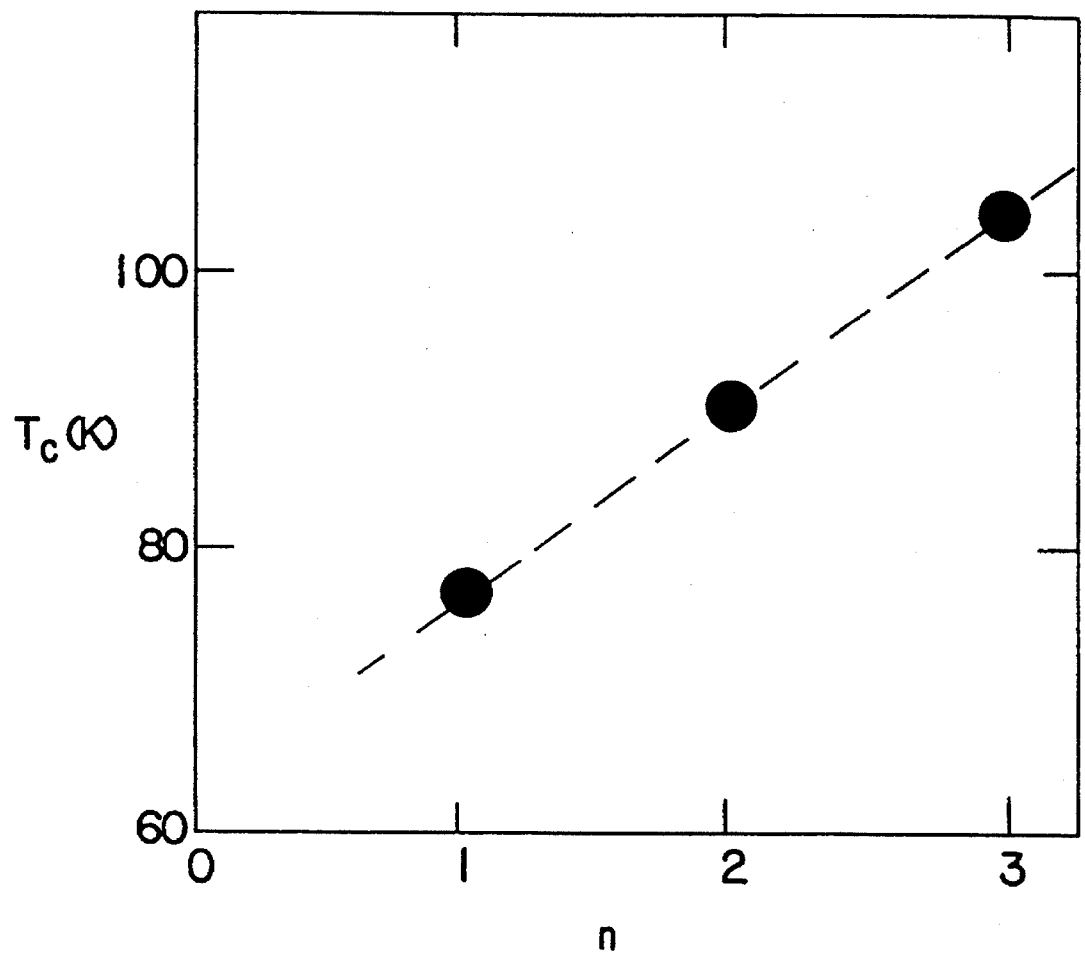

FIG. 6A shows a plot of zero resistance $T_C$ against the annealing temperature in air from which the sample was quenched into liquid nitrogen. (X) $Bi_{2.1}Ca_2Sr_2Cu_3O_{10}$; (o) $Bi_{2.1}CaSr_2Cu_2O_5$; (+) $Bi_{2.1}Ca_{0.5}Sr_{2.5}Cu_2O_5$; (Δ) $Bi_{2.1}Ca_{1.5}Sr_{1.5}Cu_2O_5$; (●) $Bi_{2.1}CaSr_2Cu_2O_5$ quenched from 2% oxygen; (□) $Bi_{2.1}Ca_{0.67}Sr_{1.33}CuO_6$; (◊) $Bi_{2.1}CaSrCuO_6$. FIG. 6B shows a plot of maximum $T_c$ versus, n the number of Cu layers.

Figure 7:
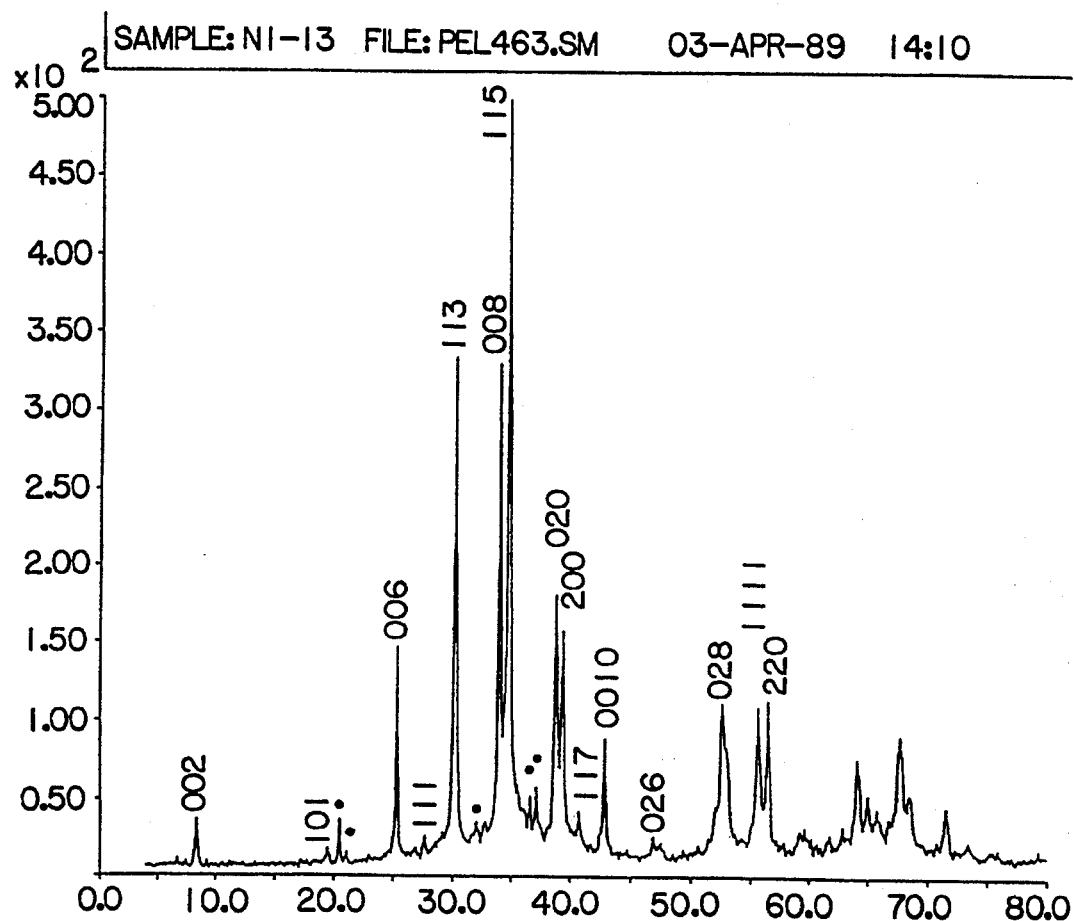

FIG. 7 shows a plot of the XRD diffraction patterns for $Bi_{1.35}Pb_{0.35}Ca_{0.4}Sr_{1.4}CuO_{6+d}$ obtained using CoKa radiation.

Figure 8A:
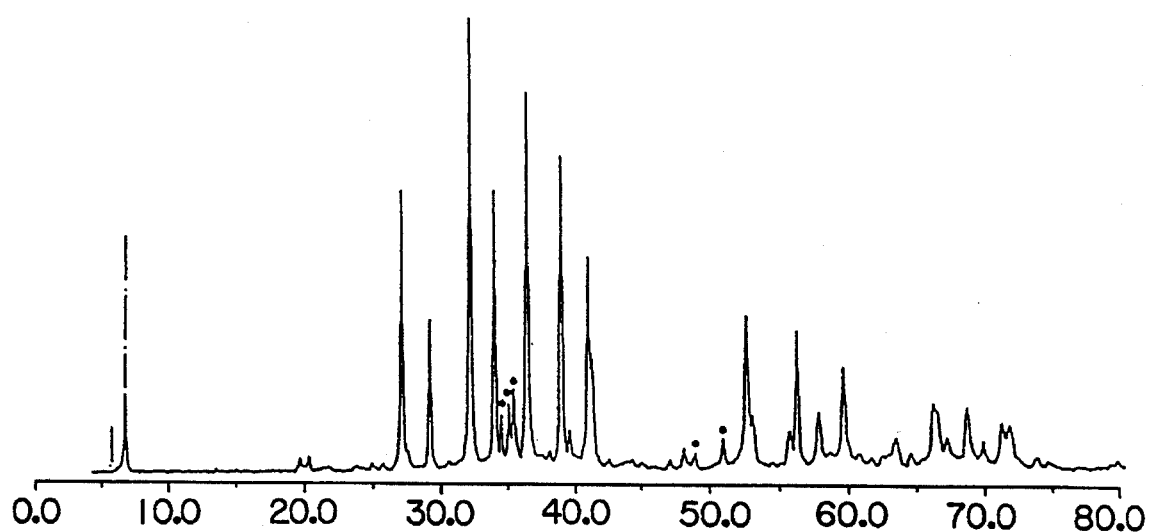

FIG. 8A shows the XRD pattern for the Pb-substituted compound wherein n=2 and x=0.2.

Figure 8B:
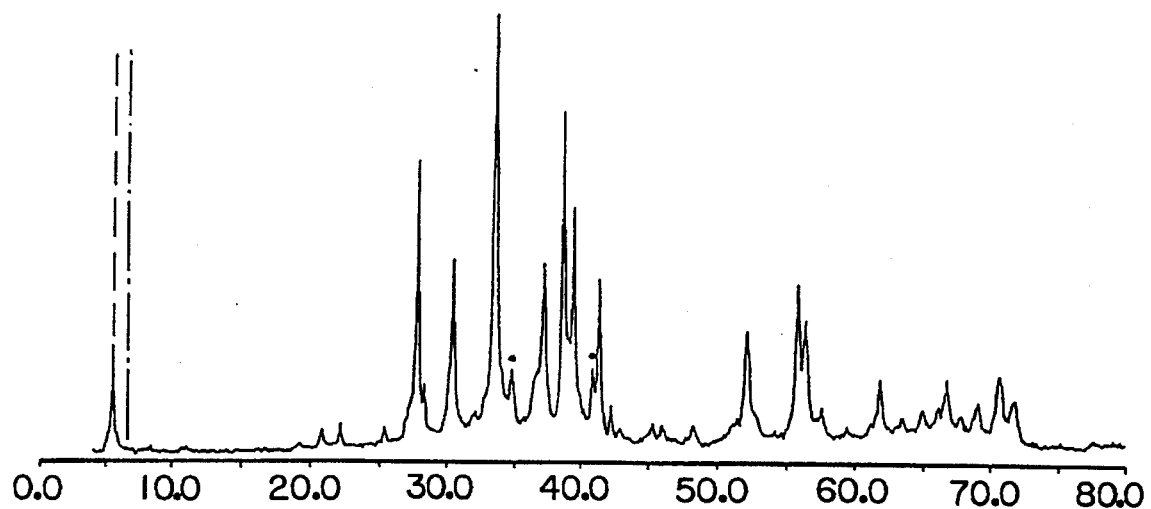

FIG. 8B shows the XRD pattern for the Pb-substituted compound wherein n=3 and x=0.35.

Figure 9A:
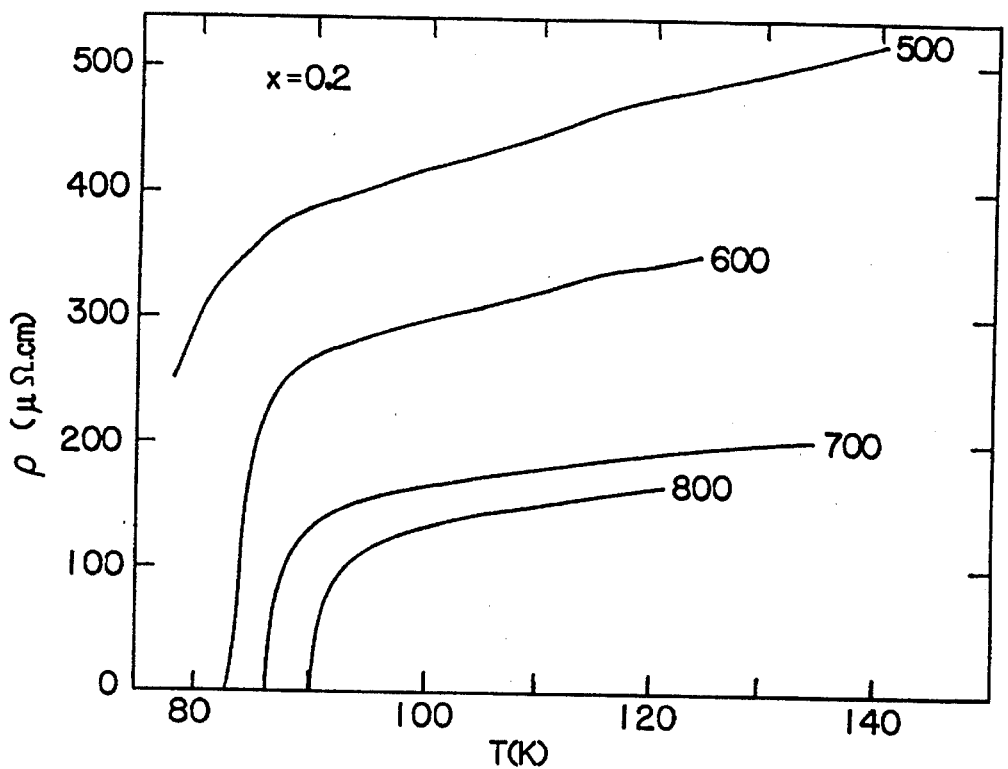

FIG. 9A shows the temperature dependence of the resistivity for Pb-substituted n=2 material for x=0.2.

Figure 9B:
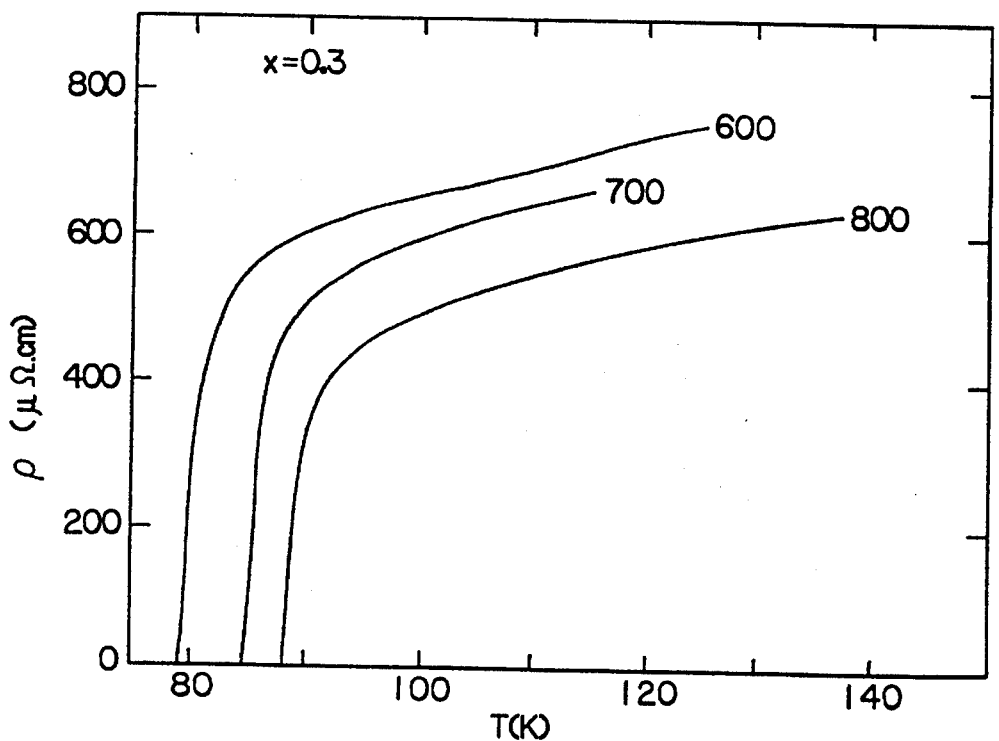

FIG. 9B shows the temperature dependence of the resistivity for Pb-substituted n=2 material for x=0.3.

FIG. 10 shows the zero resistance $T_C$ obtained as a function of anneal temperature for the n=2 and n=3 unsubstituted (open symbols, x=0) and Pb-substituted samples (filled symbols). O: n=2, x=0.2, 21% oxygen; □: n=2, x=0.2 2% oxygen; Δ: n=2, x=0.2 0.2% oxygen; and ◊: n=3, x=0.35, 21% oxygen.

Figure 11A:
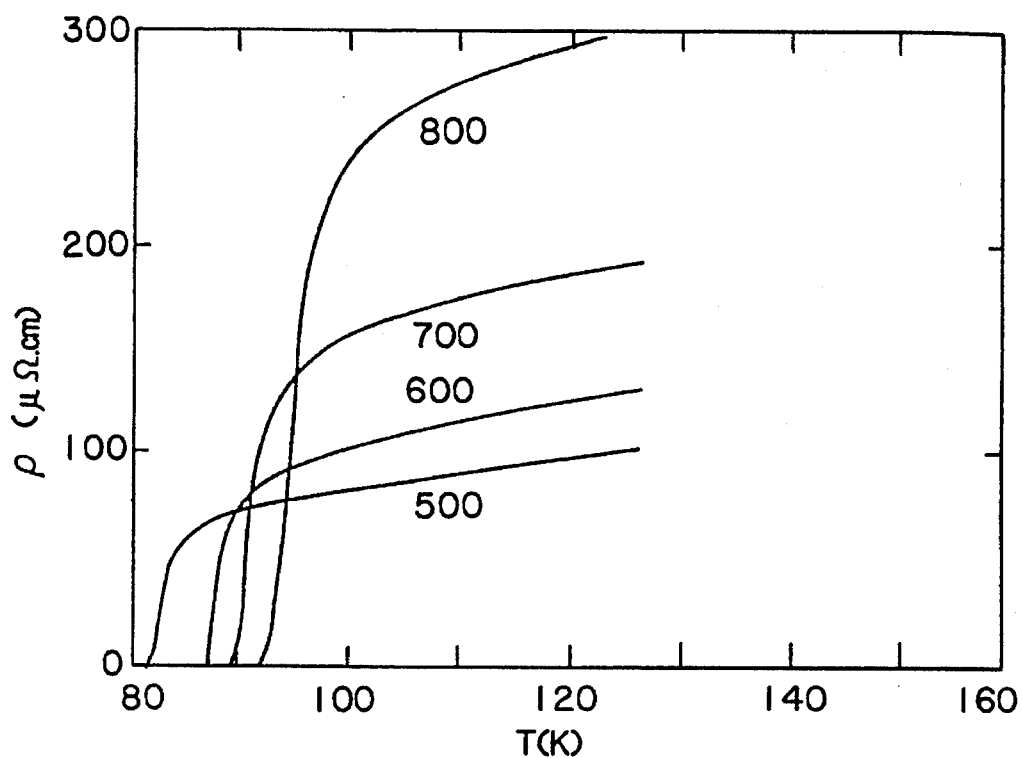

FIG. 11A shows the temperature dependence of resistivity for n=2 and x=0.2 reacted at 800° C. then annealed in air at 800°, 700°, 600°, and 500° C. before quenching into liquid nitrogen.

Figure 11B:
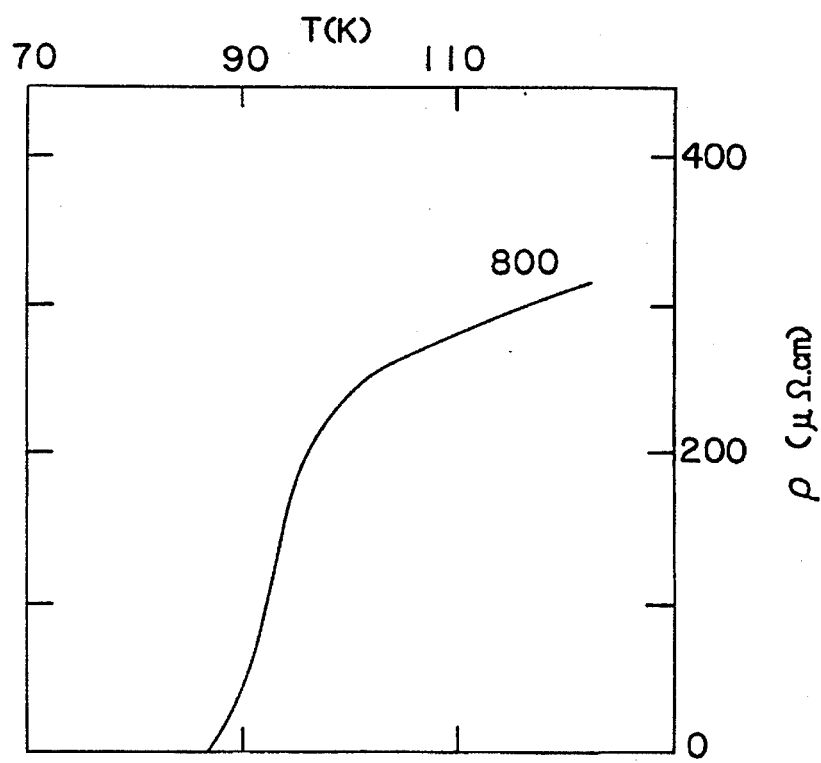

FIG. 11B shows a typical resistivity versus temperature curve for the unsubstituted (x=0) n=2 material annealed at 800° C.

Figure 11C:
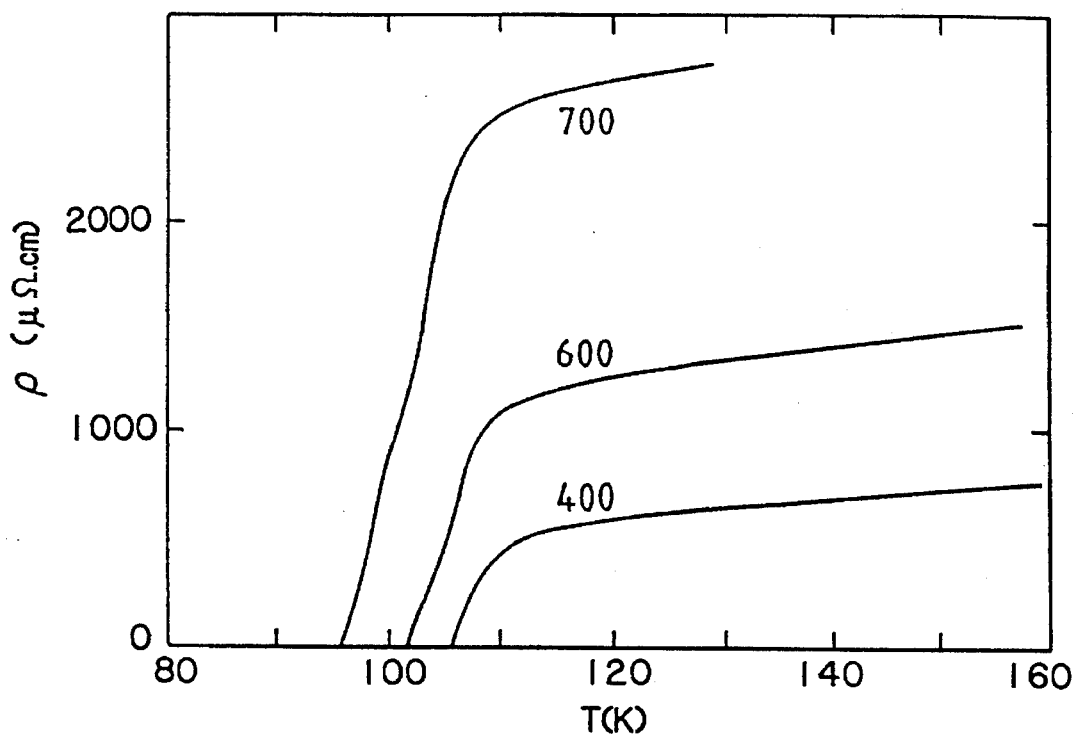

FIG. 11C shows the temperature dependency of resistivity for n=3, x=0.35 material.

Figure 11D:
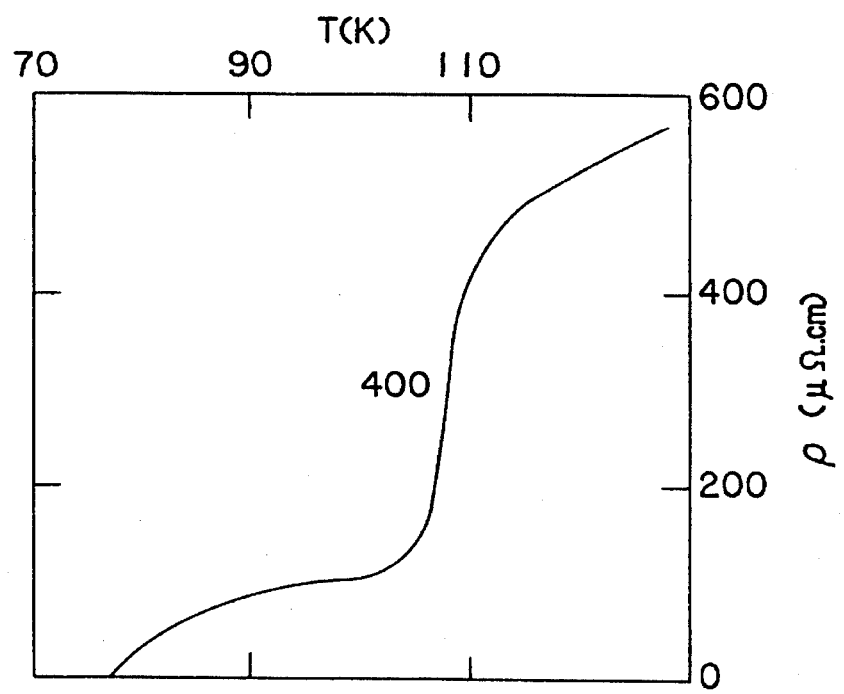

FIG. 11D shows a typical resistivity versus temperature curve for the unsubstituted (x=0) n=3 material annealed at 400° C.

Figure 12A:
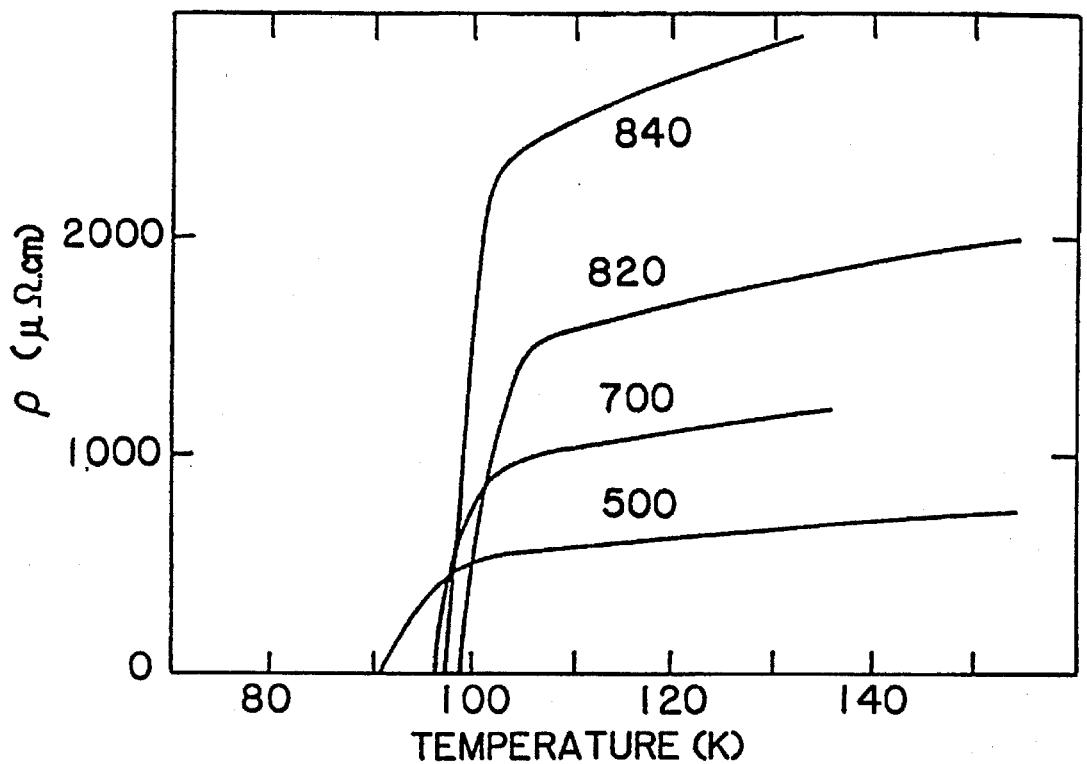

FIG. 12A shows the temperature dependence of the resistivity for $Bi_{2.1}CaSr_2Cu_2O_8$ (5% Y substitution) after being annealed in air at various temperatures shown in °C.

Figure 12B:
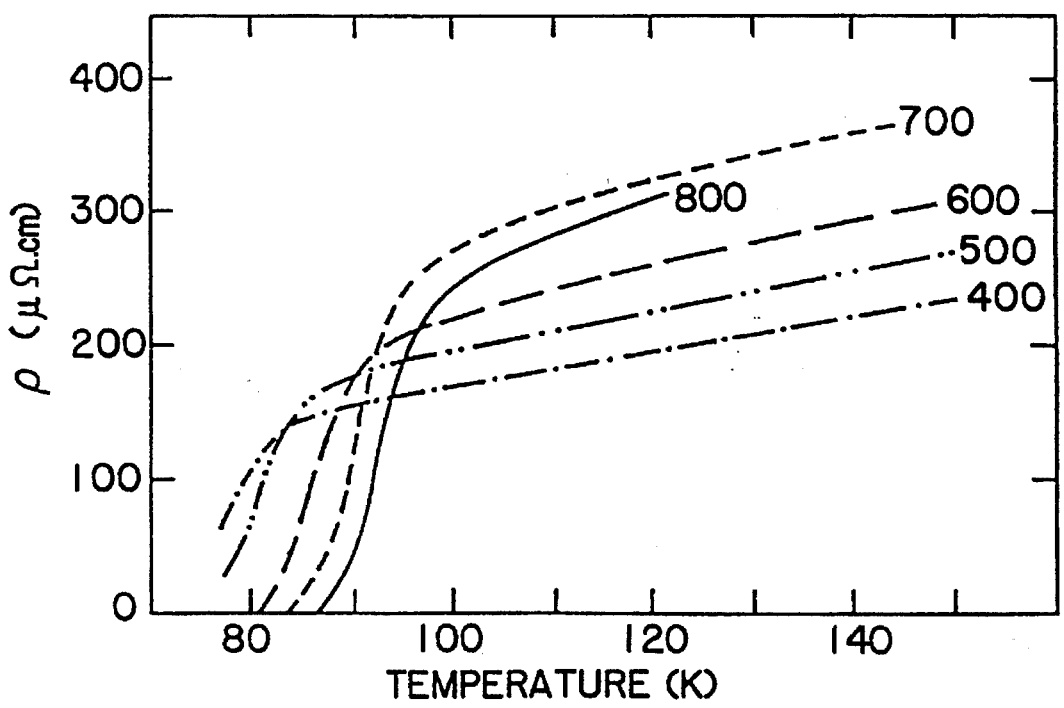

FIG. 12B shows the temperature dependence of the resistivity for $Bi_{2.1}CaSr_2Cu_2O_8$ (no Y substitution) after being annealed in air at various temperatures shown in °C.

Figure 13:
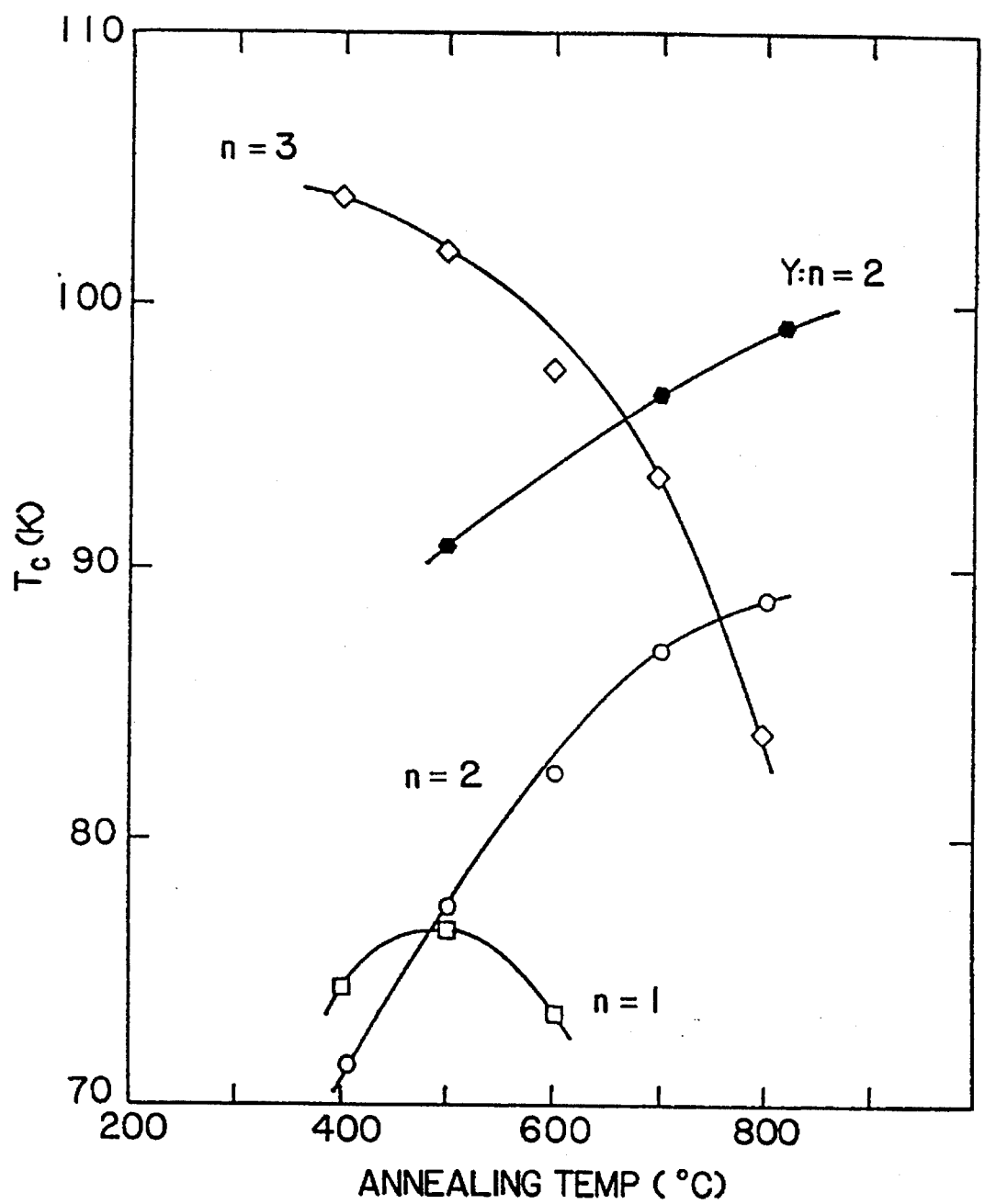

FIG. 13 shows a plot of the zero resistance $T_C$ as a function of air anneal temperature for 5% Y-substituted $Bi_{2.1}CaSr_2Cu_2O_8$ (solid hexagons). For comparison, the $T_C$ values for unsubstituted n=1, n=2 and n=3 are also shown (open data points).

Figure 14:
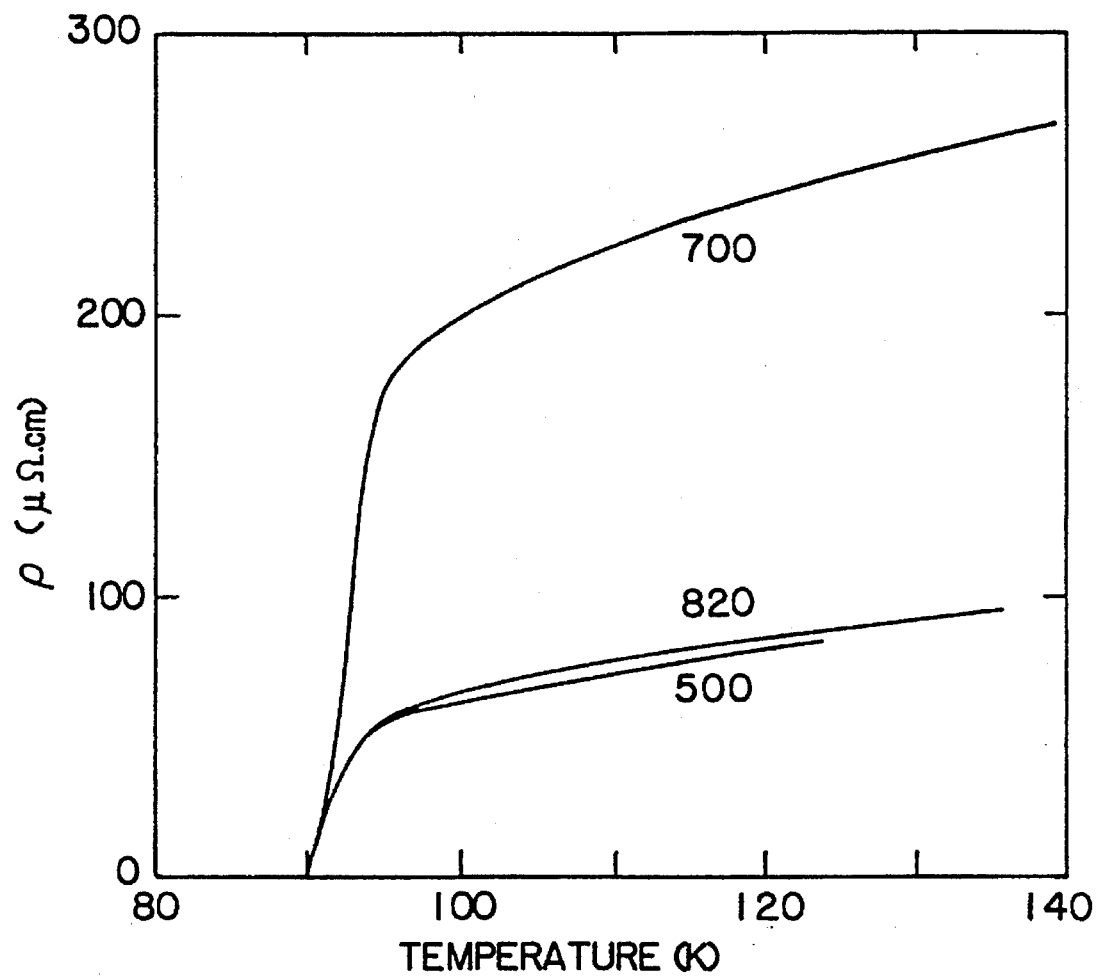

FIG. 14 shows a plot of the temperature dependence of the resistivity for the nominal composition $Bi_{1.9}Pb_{0.35}Ca_{0.9}Y_{0.1}Sr_2Cu_2O_8$ annealed and quenched at 500° C., 700° C. and 820° C. showing no change in $T_C$.

Figure 15A:
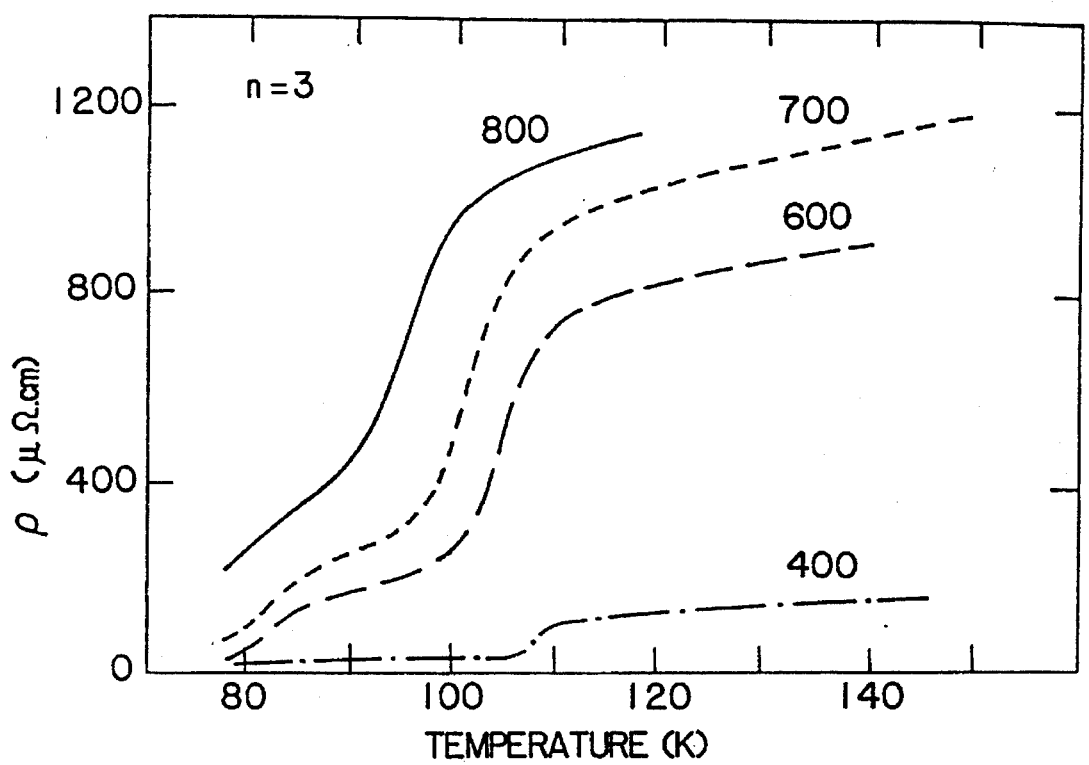

FIG. 15A shows a series of resistivity plots against temperature for n=3 material after annealing in air and then quenching into liquid nitrogen. The annealing temperatures are indicated in °C.

Figure 15B:
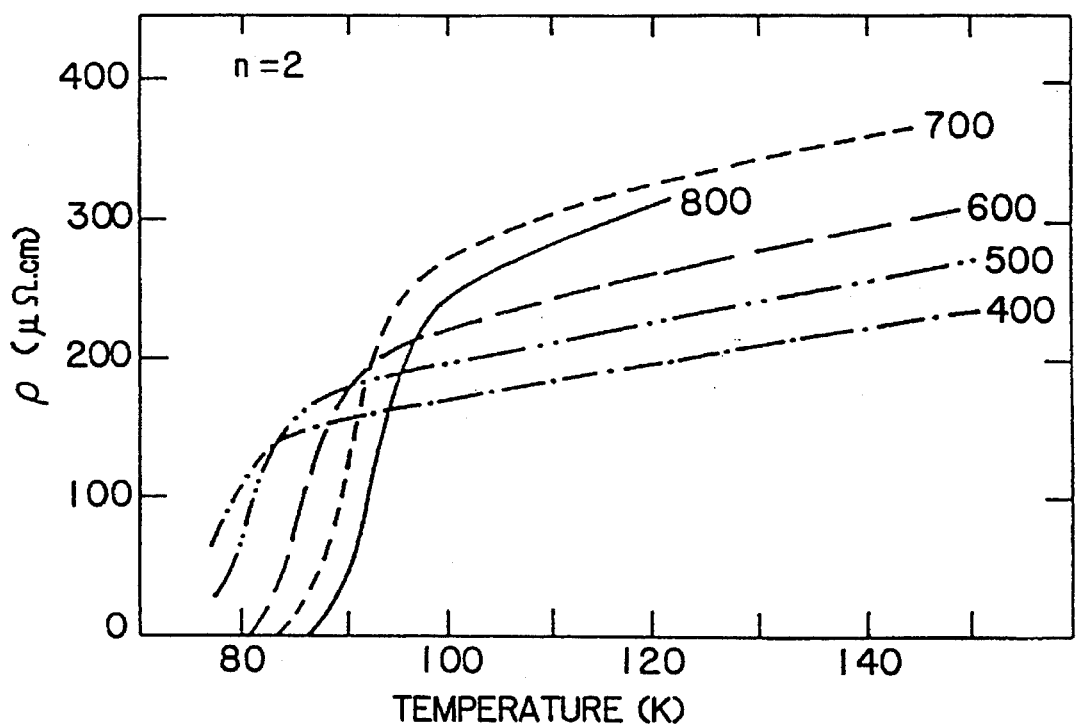

FIG. 15B shows a series of resistivity plots against temperature n=2 material after annealing in air and then quenching into liquid nitrogen. The annealing temperatures are indicated in °C.

Figure 16A:
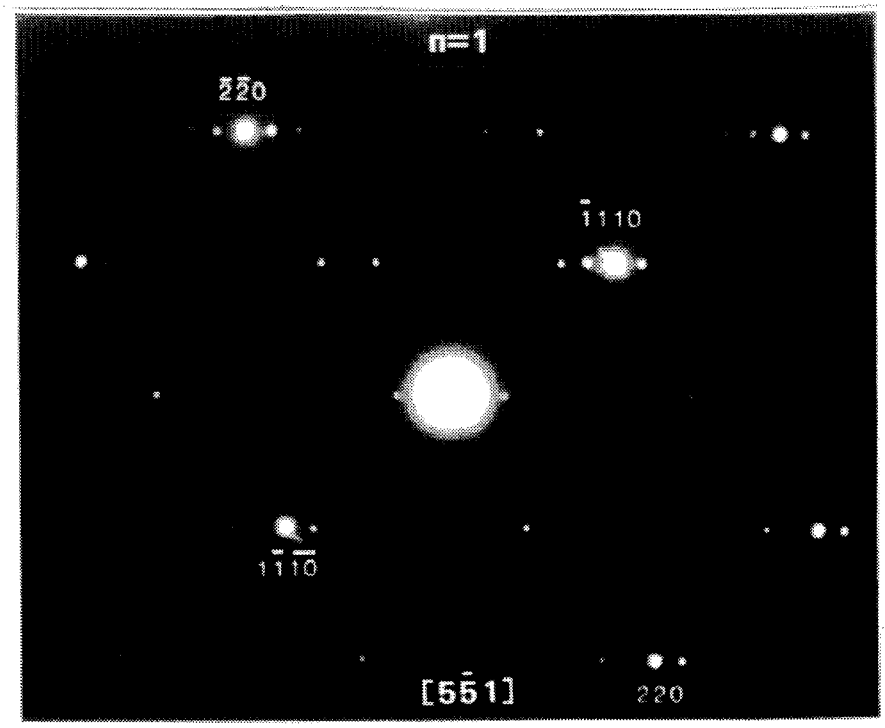

FIG. 16A shows the zone axis electron diffraction pattern for n=1 material indexed on a 5.4 Å×5.4 Å×2cÅ cell where c=18.3+6.3n Å.

Figure 16B:
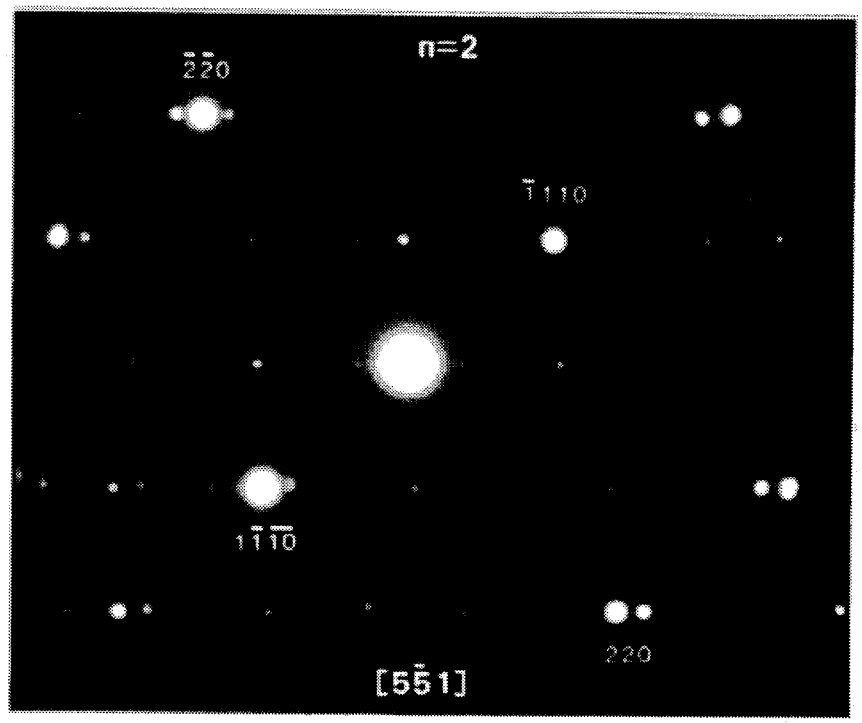

FIG. 16B shows the zone axis electron diffraction pattern for n=2 material indexed on a 5.4 Å×5.4 Å×2cÅ cell where c=18.3+6.3n Å.

Figure 16C:
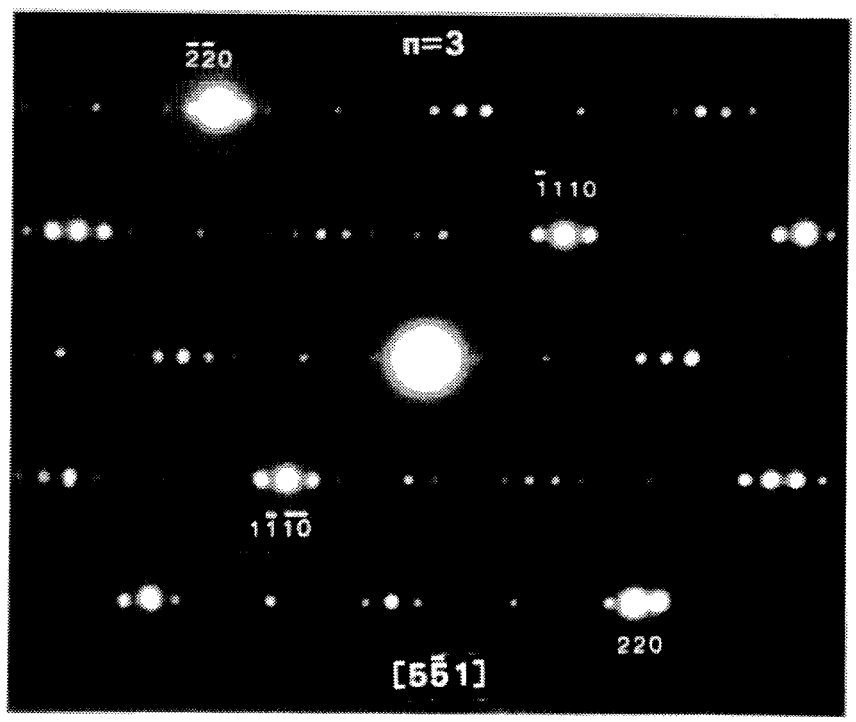

FIG. 16C shows the zone axis electron diffraction pattern for n=3 material indexed on a 5.4 Å×5.4 Å×2cÅ cell where c=18.3+6.3n Å.

EXAMPLE 1 (n=0)

Samples of composition $Bi_{2+e}SrO_{4+d}$ with e=0, 0.25, 1.25 and 2 were prepared by solid-state reaction of $Bi_2O_3$ and $SrCO_3$ at 740° C. in gold crucibles for 15 hrs. All samples were quenched from the furnace into liquid nitrogen and investigated by x-ray diffraction, electron diffraction and SEM electron-beam x-ray analysis to confirm compositions of crystallites. The e=0 material was white-yellow of orthorhombic structure with lattice parameters a=4.26 Å, b=6.10 Å and C=19.38 Å while the remaining solid-solution compositions were yellow with rhombohedral symmetry and lattice parameters varying smoothly with composition given by a=9.852–0.09e Å and α=23.28+0.2e°.

Figure 1:
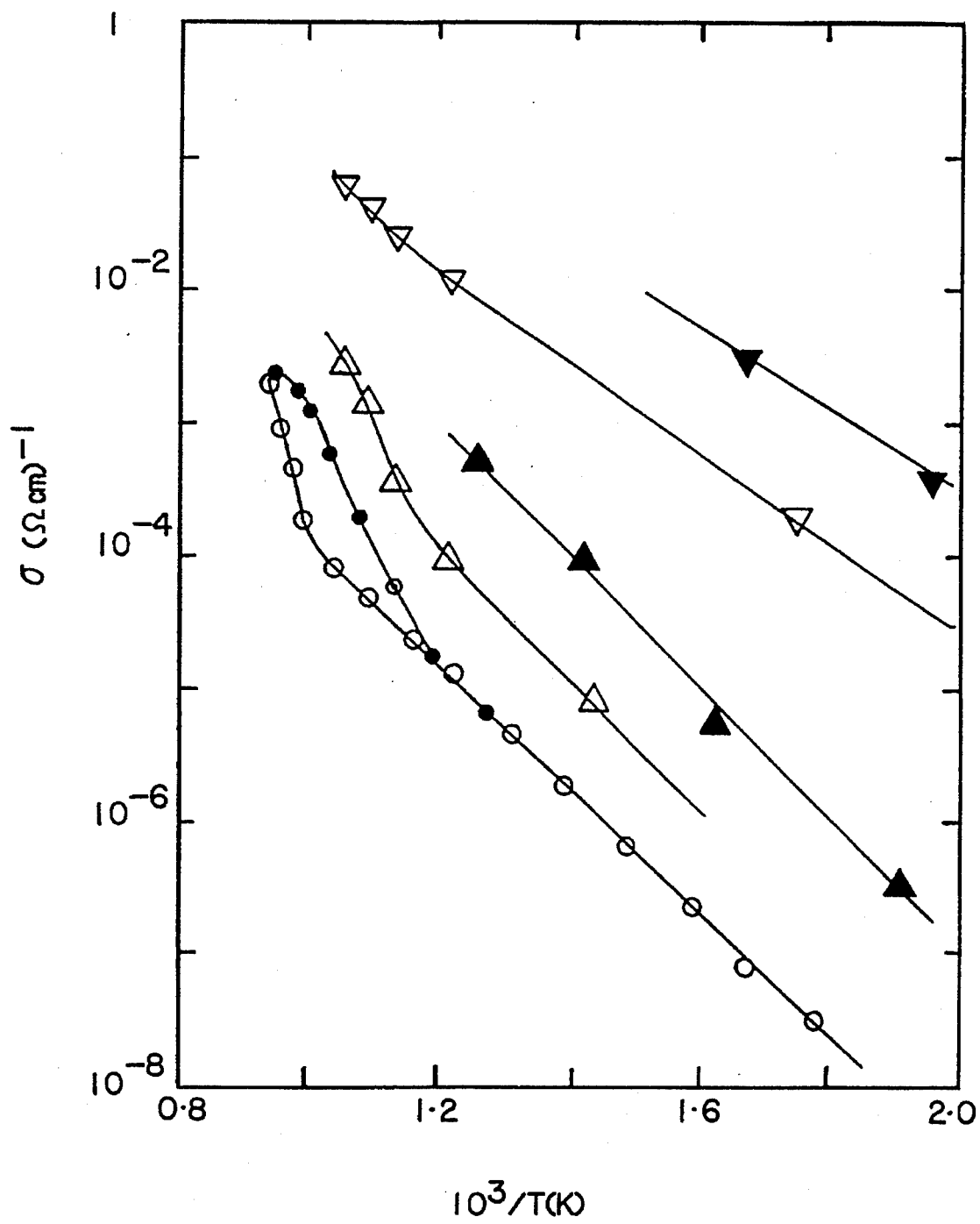
Figure 2A:
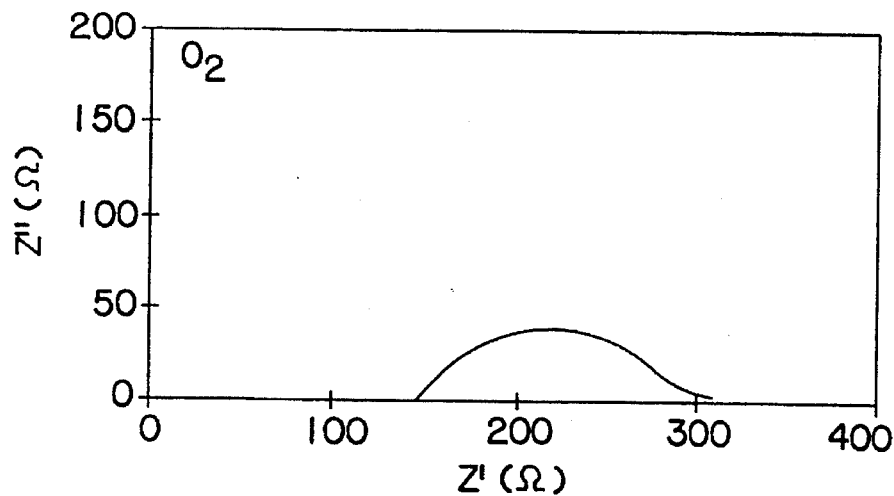
FIG. 2A shows a Cole-Cole plot of Z" versus Z' measured at 644° C. for $Bi_2SrO_4$ in oxygen.
Figure 2B:
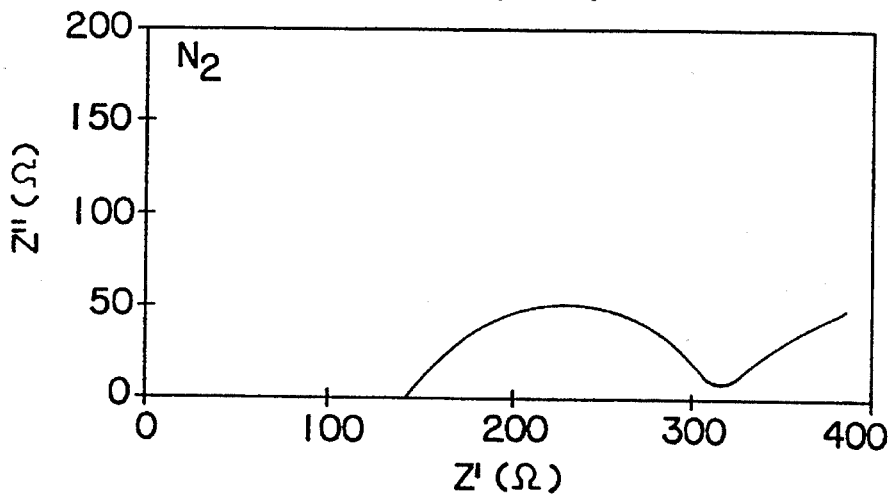
FIG. 2B shows a Cole-Cole plot of Z" versus Z' measured at 644° C. for the $Bi_2SrO_4$ sample of FIG. 2A in nitrogen.
Figure 2C:
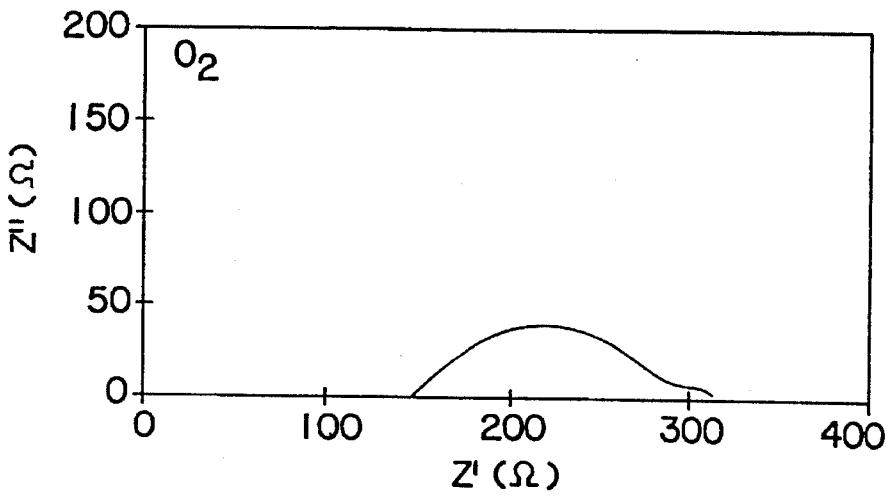
FIG. 2C shows a Cole-Cole plot of Z" versus Z' measured at 644° C. for the $Bi_2SrO_4$ sample of FIG. 2B in oxygen.
Figure 3A:
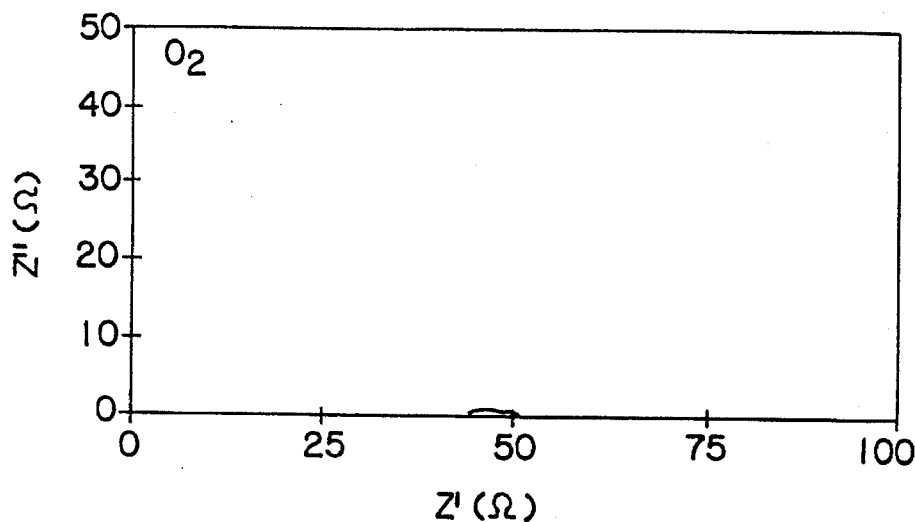
FIG. 3A shows a Cole-Cole plot of Z" versus Z' measured at 736° C. for $Bi_2SrO_4$ in oxygen.
Figure 3B:
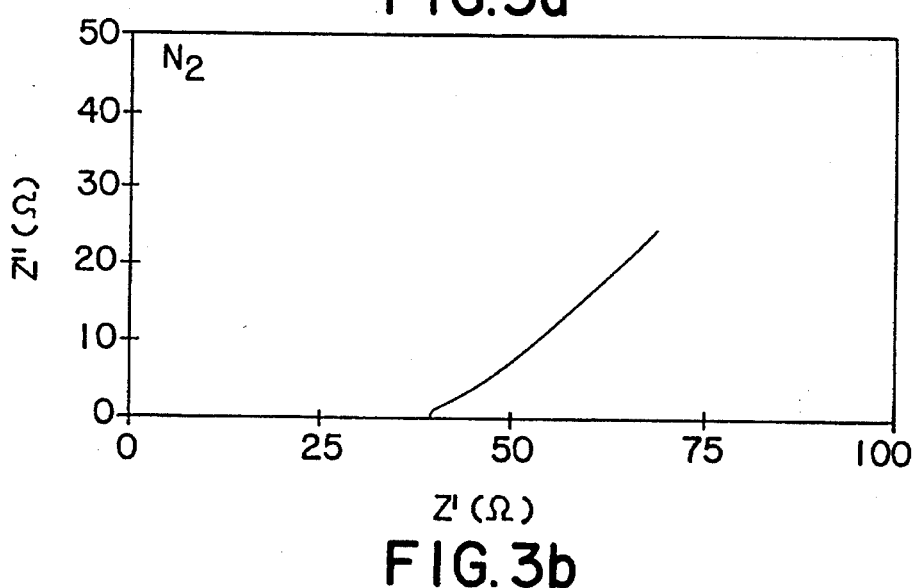
FIG. 3B shows a Cole-Cole plot of Z" versus Z' measured at 736° C. for the $Bi_2SrO_4$ sample of FIG. 3A in nitrogen.
Figure 3C:
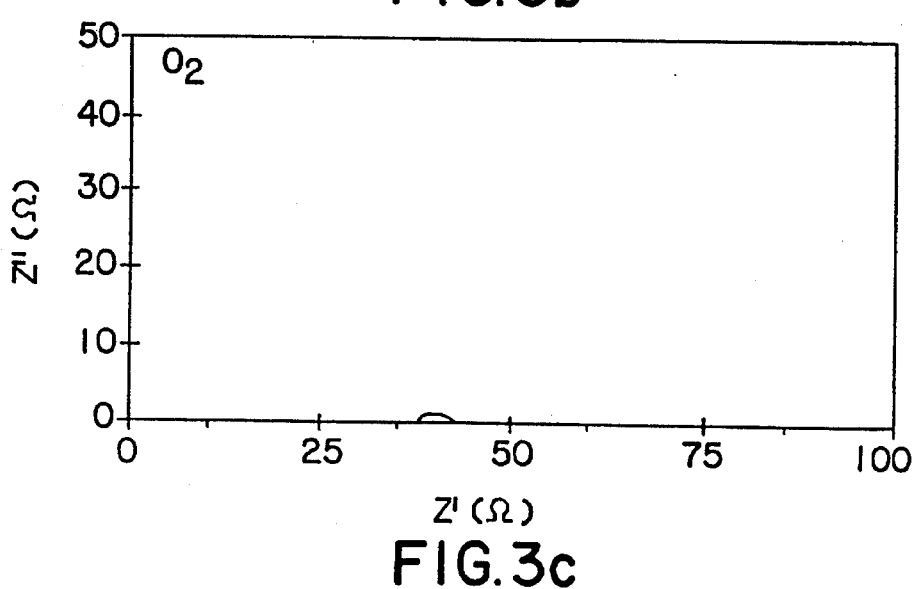
FIG. 3C shows a Cole-Cole plot of Z" versus Z' measured at 736° C. for the $Bi_2SrO_4$ sample of FIG. 3B in oxygen.

FIG. 1 shows the electrical conductivity measured at 1592 Hz for the e=0 material. This shows a rapid rise in conductivity above 700° C. towards values typical of solid-state electrolytes. The rapid rise coincides with a broad endothermic DTA peak indicative of a diffuse fast-ion transition. Complex impedance spectroscopy reveals three separate relaxation peaks: a broad low-frequency peak with effective capacitance in the microFarad range which is attributable to inter-granular impedance; and two higher frequency peaks attributable to oxygen-ion relaxation. The conductivities associated with these two high frequency peaks are plotted as the open triangles in FIG. 1. FIGS. 2A, 2B and 2C show Cole-Cole plots at 644° C. in oxygen (FIG. 2A), then in nitrogen (FIG. 2B), then in oxygen (FIG. 2C) while FIGS. 3A, 3B and 3C show the same sequence at 736° C. In nitrogen a distinct Warburg-type impedance appears with the characteristic 45° slope. This arises from the diffusive depletion of oxygen ions at the surface when in an oxygen-free ambient and confirms the origin of the conductivity in oxygen-ion transport. A concentration cell was constructed using a sintered pellet of e=0 material over which a difference in oxygen partial pressure was maintained while the cell emf was measured. If the transport coefficient is dominated by oxygen-ion mobility rather than electron transport then the emf $V_{12}$ is given by the Nernst equation $$V_{12}=(RT/nF)\ln(p_1/p_2)$$

Figure 4:
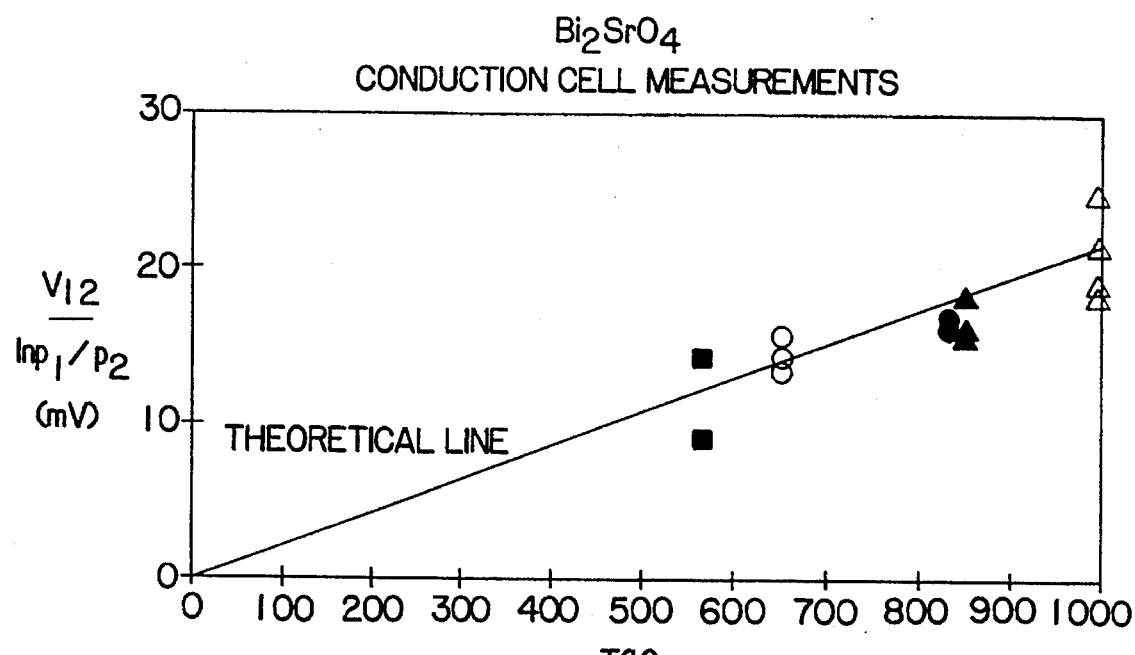
FIG. 4 shows $V_{12}/\ln(p_1/p_2)$ plotted against temperature where $V_{12}$ is the potential developed over a concentration cell using $Bi_2SrO_4$ as the electrolyte with oxygen partial pressures of $p_1$ and $p_2$ on either side of the cell.

Here R is the gas constant, T is temperature in degrees Kelvin, F is the Faraday constant and n (=4) is the number of moles of electron charge produced by one mole of $O_2$. $p_1$ and $p_2$ are the partial pressures of oxygen on either side of the cell. FIG. 4 shows $V_{12}/\ln(p_1/p_2)$ plotted against T and the data follows the ideal theoretical line with slope R/nF, thus confirming that the transport number is dominated by the oxygen-ion transport number.

EXAMPLE 2 (n=0)

Samples of composition $Bi_2Sr_{1-z}Na_zO_{4+d}$ for z=0.1 and z=0.2 were prepared at 770° C. by reaction of the carbonates of Na and Sr with $Bi_2O_3$ for 15 hrs. XRD showed that these were single phase exhibiting the same orthorhombic structure as the unsubstituted e=0 material. The conductivities associated with the two high frequency complex impedance relaxations are plotted as solid triangles and these show enhancements in conductivity above that for unsubstituted material of 10 times and 30 times respectively.

EXAMPLE 3 (n=0)

Figure 5:
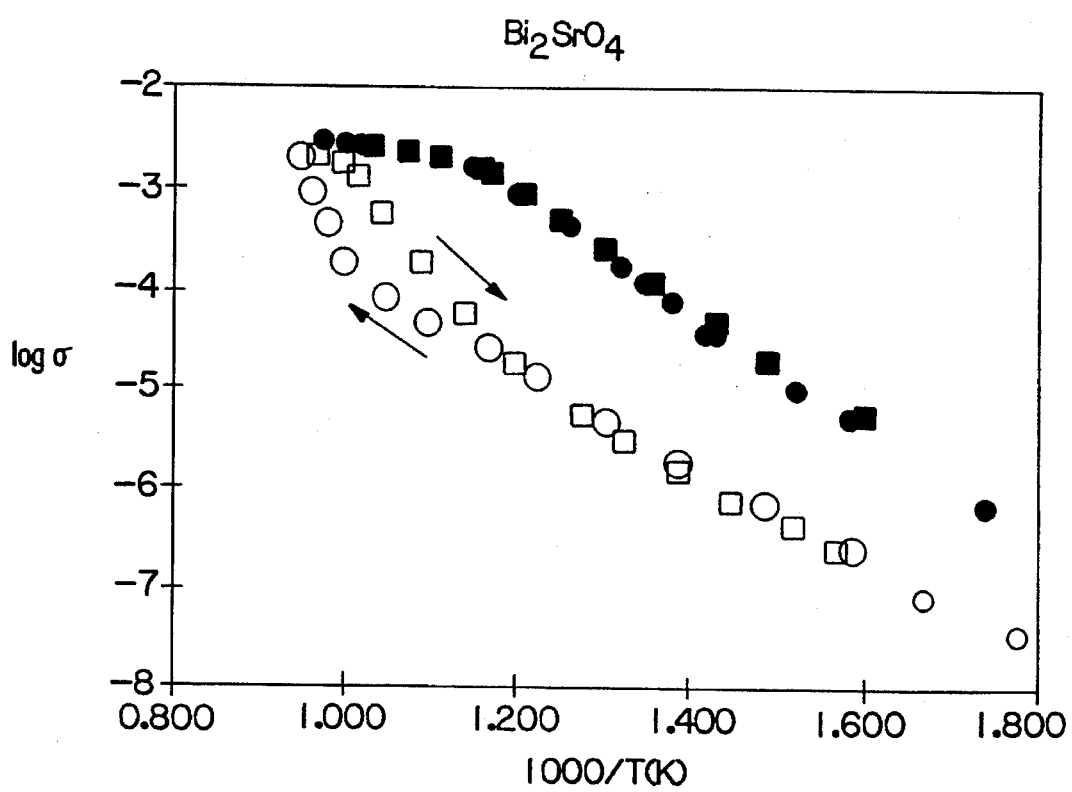
FIG. 5 shows a plot of the conductivity measured at 1592 Hz as a function of temperature for $Bi_2Sr_{0.5}Ca_{0.5}O_4$ (solid symbols) and for $Bi_2SrO_4$ (open symbols).

Samples of composition $Bi_2Sr_{1-z}Ca_zO_{4+d}$ for z=0.33 and z=0.5 were prepared at 770° C. by reaction of the carbonates of Ca and Sr with $Bi_2O_3$ for 15 hrs. XRD showed that these were single phase materials exhibiting the same hexagonal structure as occurs in the unsubstituted e>0 solid-solubility range. Lattice c-parameters obtained were 19.14 Å (z=0.33) and 19.06 (z=0.5). In addition, electron diffraction reveals the existence of a superstructure in the basal plane as evidenced by hexagonal satellites encircling each principal diffraction spot. For z=0.33 the superstructure length is 2.76 times the a-parameter. FIG. 5 shows conductivity measured at 1592 Hz for z=0.5 (solid symbols) and this is compared with the unsubstituted z=0 conductivity (open symbols) and Y-stabilised zirconia. Over much of the range the conductivity is enhanced by Ca-substitution by a factor of 100 times and is comparable to Y-zirconia.

EXAMPLE 4 (n=0)

Samples of composition $Bi_{2+x-y}Pb_ySrO_w$ with $0 \leq x \leq 0.2$ and y=0.2 and y=0.4 were prepared by stoichiometric reaction of $Bi_2O_3$, $SrCO_3$ and PbO at 770° C. and quenched into liquid nitrogen producing a bright yellow sintered material.

The structure as prepared was predominantly orthorhombic with the same structure as the unsubstituted material. When annealed and quenched from 500° C. the rhombohedral structure of the unsubstituted solid-solution was adopted and the colour became brown/green. Additional phases were not evident indicating complete substitution at the y=0.4 level. Impedance spectroscopy showed that the mid-and high-frequency relaxation peaks overlapped, producing a single broadened relaxation peak. The conductivity associated with this peak measured during heating of the as prepared material increased with Pb-substitution but on cooling the conductivity remained high.

EXAMPLE 5 (n=1)

Samples corresponding to the starting composition $Bi_2Sr_{2-x}Ca_xCuO_{6+d}$ were prepared by reacting carbonates of Sr and Ca with the oxides of Bi and Cu at temperatures between 780° and 830° C. for periods of time ranging from 1 to 12 hrs. The n=1 phase is promoted by short reaction times (1 to 2 hrs.), temperatures near 800° C. and lower calcium content. We could not prepare the calcium-pure phase x=2, but nearly single-phase material was obtained for s=0, 0.67 and 1.0. The structure was pseudotetragonal with lattice parameters, respectively of a=5.414 Å and c=24.459 Å, a=5.370 Å and c=24.501 Å, and a=5.370 Å and c=24.287 Å. For s=0.67 and s=1.0 incommensurate superlattice structures in the b-direction were observed with dimension ranging from 4.3 to 5.3 times the a-parameter.

Samples were annealed to equilibrium oxygen stoichiometry at various temperatures in air, then rapidly quenched from the furnace into liquid nitrogen. The DC electrical resistivity was measured with a four terminal technique and the zero-resistance $T_C$ is plotted in FIG. 6A with squares and diamonds as a function of anneal temperature. $T_C$ evidently passes through a maximum corresponding to the optimum oxygen stoichiometry.

The true c-axis length may be twice the figure quoted above due to a two-times c-axis superstructure. Electron diffraction patterns interpreted as $[5\bar{5}1]$ zone-axis patterns may be uniquely indexed on a 5.4 Å×5.4 Å×49 Å unit cell. The same applies to all other n=1,2 and 3 electron diffraction patterns investigated suggesting a general unit cell of 5.4 Å×5.4 Å×2c Å where c is approximately 18.3+6.3nÅ.

EXAMPLE 6 (n=1)

Samples of nominal composition $Bi_{1.6}Pb_{0.2}Sr_{1.3}Ca_{0.7}CuO_{6+d}$, $Bi_{1.6}Pb_{0.2}SrCaCuO_{6+d}$, and $Bi_{1.9}Pb_{0.36}Sr_{1.3}Ca_{0.7}CuO_{6+d}$, were prepared by reacting stoichiometric proportions of $Bi_2O_3$, $Pb(NO_3)_2$, $Sr(NO_3)_2$, $Ca(NO_3)_2$ and CuO. The n=1 materials are favoured by short reaction times and as a consequence the nitrates are advantageous as they allow homogeneous and rapid mixing in the nitrate melt. The precursor materials were milled, pressed into pellets and reacted at 800° C. for 15 minutes, remilled, pressed into pellets and sintered for 1 hr at the same temperature. The resultant materials were very nearly single phase n=1 materials. The first of the compounds listed above was apparently tetragonal with parameters a=5.355 Å and c=24.471, but this material and even more predominantly the third material with x=0.35 and y=0.7 showed the presence of of particles of composition $Bi_{1.66}Pb_{0.35}Sr_{1.4}Ca_{0.4}CuO_{6+d}$. By reacting precursors of this composition good phase-pure material was obtained as shown by FIG. 7. Impurity peaks are indicated by dots. This material is orthorhombic with parameters a=5.313 Å, b=5.391 Å and c=24.481 Å, and, moreover it is semiconducting.

EXAMPLE 7 (n=2)

Samples of nominal composition $Bi_{2.1}Sr_{2-y}Ca_{1+y}Cu_2O_{6+d}$, with y=−0.5, −0.25, 0 and 0.5 were prepared using stoichiometric proportions of the carbonates of Sr and Ca and the oxides of Bi and Cu reacted at temperatures between 860° and 870° C. for 8 to 15 hrs. The resulting material was ground, milled, pressed into pellets and sintered for another 8 to 15 hrs at 860° to 870° C. in air. This procedure produced very nearly single-phase material with a systematic variation in lattice parameters as shown in the table below confirming the intersubstitution of Sr and Ca. As lattice parameters are dependent upon oxygen stoichiometry determined by annealing temperature and ambient oxygen partial pressure, all these XRD measurements were carried out on materials quenched into liquid nitrogen after annealing for up to 12 hrs at 400° C. in air.

| y | a | c |
|---|---|---|
| −0.5 | 5.415 | 30.908 |
| −0.25 | 5.410 | 30.894 |
| 0 | 5.405 | 30.839 |
| 0.5 | 5.402 | 30.683 |

The structure is centred pseudotetragonal as described by Subramanian et al for the y=0 material in Science 239, 1015 (1988). Electron diffraction shows that a 4.75 times incommensurate superstructure exists in the b-direction and as indicated in example 5 there may be a two times superlattice in the c-direction as indicated by the $[5\bar{5}1]$ zone axis electron diffraction pattern.

As discussed in example 5 the zero-resistance $T_C$ was measured for samples annealed at various temperatures and oxygen partial pressures. The data for anneals in air is plotted in FIG. 6A for the y=−0.5, y=0 and y=0.5 samples by plusses, circles and squares respectively. Again $T_C$ maximises at an optimum oxygen stoichiometry for each composition. The solid circles are obtained for anneals of the y=0 material in 2% oxygen and the displacement of the curve confirms that the optimisation is associated with oxygen stoichiometry. We find that the lattice c-parameter varies with anneal temperature but for two different pairs of oxygen partial pressure and anneal temperature which give the same $T_C$ the lattice parameters are also the same.

EXAMPLE 8 (n=2)

Samples of composition $Bi_{2.2-x}Pb_xCaSr_2Cu_2O_{8+d}$ with x=0, 0.1, 0.2, 0.3, 0.4 and 0.5 were prepared by solid state reaction of $Bi_2O_3$, $CaCO_3$ $SrCO_3$, CuO and PbO for 12 hours at temperatures between 850° and 865° C. The samples were ground, pressed and sintered at the same temperature for a further 12 hours. FIG. 8A shows the XRD trace for x=0.2 which confirms nearly single phase material. Minor impurity peaks are marked by dots. Pb substitution is confirmed by observing a systematic variation in lattice parameters with x, as follows $$a=6.405-0.048x Å$$

and $$c=30.830-0.094x Å$$

Electron beam x-ray analysis of crystallites also confirmed the above compositions. Electron diffraction shows that the b-axis superstructure remains at about 4.75X for 0≦x≦0.2. For 0.2≦x≦0.35 this superstructure contracts to 4.5X and a second b-axis superstructure appears with length 7.3X. Substitution for x>0.35 did not occur under the conditions of preparation. Samples were annealed at various temperatures at oxygen partial pressures of $2.1\times10^4$ Pa (air), $2\times10^3$ Pa and $2\times10^2$ Pa then quenched into liquid nitrogen. The DC resistivity of these samples was measured using a 4-terminal method and AC susceptibility was also measured. FIGS. 9a and 9b show the resistivity curves for anneals in air for x=0.2 and x=0.3 respectively. $T_C$ is seen to decrease with decreasing anneal temperature. FIG. 10 shows the zero resistance $T_C$ versus annealing temperature for the three oxygen partial pressures for both x=0 and x=0.2. $T_C$ is seen to pass through a maximum for an optimum oxygen content. The maximum $T_C$ obtained is 93K. This increase is not due to n=3 material which has a different behaviour also shown in FIG. 10. The optimised $T_C$ is maximised at 93K for x=0.2 and falls 4K for x=0.3.

The sharpness of the resistive transitions should be noted in FIG. 9A and compared with the typical best curve obtained for x=0 shown in FIG. 11B which exhibits a typical resistive tail. The resistivity curves shown in FIG. 11a are for a x=0.2 sample prepared at the lower temperature of 800° C. The variation in $T_C$ as a function of anneal temperature is similar to that shown in FIG. 9a but the normal state resistivity varies differently. Electron microprobe analysis indicated crystallites which were Pb-rich and deficient in Sr and Ca indicating substitution of Pb on the alkali-earth sites.

EXAMPLE 9 (n=2)

Samples of composition $Bi_{2.1}Ca_{1-x}R_xSr_2Cu_2O_{8+d}$ were prepared by solid state reaction of $Bi_2O_3$, $CaCO_3$, $SrCO_3$, CuO and $R_2O_3$ where R is Y or one of the rare earth elements. Compositions with x=0, 0.05, 0.1, 0.2, 0.4, 0.9 and 1.0 were reacted at temperatures ranging from 860° C. to 900° C. as the rare earth content was increased. Samples were investigated by x-ray diffraction, electron diffraction, IR spectroscopy, thermal gravimetry, and the temperature dependence of resistivity and AC susceptibility. In the following example we deal exclusively with the results for Y-substitution.

The end member x=1 was XRD phase pure and notably has the same structure as $Bi_{2.1}CaSr_2Cu_2O_{8+\delta}$ except that the symmetry is reduced from tetragonal to orthorbombic as shown by the splitting of the (200) XRD peak. For $Bi_{2.1}YSr_2Cu_2O_{8+\delta}$, annealed in air at 400° C. the lattice parameters are a=5.430 Å, b=5.473 Å and c=30.180 Å. Electron diffraction also reveals the presence of an 8X incommensurate superstructure, of 43.5 Å in the b-direction.

Attempts to study the metal to insulator transition at intermediate substitutions (0<x<1) were prevented by the absence of a substitutional solubility range under the conditions of preparation. In this intermediate range samples were a mixed phase of the x=0 and x=1 end-members except at compositions close to x=0 and x=1 where doping appears to be possible. Interestingly, Y substitution for Ca at the 5% level in $Bi_{2.1}CaSr_2Cu_2O_{8+d}$ appears to raise $T_C$. FIG. 12a shows the temperature dependence of the resistivity for such a sample annealed and quenched at different temperatures in order to vary the oxygen stoichiometry, d. This may be compared with the same data shown in FIG. 12b for the x=0 unsubstituted n=2 material. The substitution has both sharpened the resistive transition and raised the zero resistance $T_C$. Otherwise the overall behavior is similar and quite distinct from the n=3 behaviour.

The zero-resistance $T_C$ is plotted in FIG. 13 as a function of anneal temperature (solid data points) and evidently $T_C$ is maximised at >101K. FIG. 13 also includes $T_C$ data for unsubstituted n=1, n=2 and n=3 material for comparison. Like unsubstituted n=2 the Y-substituted material appears to exhibit a maximum $T_C$ for anneals in air above 820° C. However, above this temperature the effects of annealing and quenching are greatly modified by the proximity of a phase transition. In order to achieve maximum $T_C$ anneals at an oxygen partial pressure less than that of air is required. The highest zero resistance $T_C$ we have observed in this system is 102K. The elevated $T_C$ does not arise from the presence of n=3 material for several reasons:

i) We are able to prepare single-phase n=3 material by Pb-substitution for Bi. Attempts to substitute Y in this material at the 5% level drives the reacted material completely to the n=2 phase together with the binary $Ca_2CuO_3$. We would therefore hardly expect Y substitution of the n=2 material to promote n=3 material.

ii) The annealing behaviour of $T_C$ is similar to that for unsubstituted n=2 material with maxima occurring at 820° C. or higher. The maximum $T_C$ for n=3 occurs for anneals at ≈400° C. and for anneals at 820° C. the n=3 $T_C$ is as low as 80K.

Particle by particle analyses by SEM electron beam x-ray analysis indicates that Ca remains fixed at one per formula unit while Sr is slightly depleted. This suggests Y substitution on the Ca-site accompanied by Ca substitution on the Sr-site with the formula $Bi_{2.1}(Ca_{0.95}Y_{0.05})(Sr_{1.95}Ca_{0.05})Cu_2O_8$. Starting compositions appropriately depleted in Sr indeed offered the best resistive transitions around 100K with a minimal tail.

It may be that the substitutional solubility tends to occur only at grain boundaries as the sharp resistive transition to zero at 101K is accompanied by only a small diamagnetic signal in the AC susceptibility commencing at ≈99K. A sharp fall does not commence until ≈95K at which point the diamagnetic signal is only about 5% of its fully developed value. The yttrium should therefore be dispersed more uniformly throughout a sample by reaction of nitrates or by melt processing.

This example and particularly the chemical formula deduced for the active phase responsible for raising $T_C$ is presented by way of example without loss of generality. Because of the small diamagnetic signal appearing at ≈100K it may be that the active phase is of another composition and structure incorporating Bi/Ca/Y/Sr/Cu/O.

EXAMPLE 10 (n=2)

Predominantly single phase $Bi_{1.9}Pb_{0.35}Ca_{0.9}Y_{0.1}Sr_2Cu_2O_{a+\delta}$ was prepared by solid state reaction of a pressed disc of $Bi_2O_3$, PbO, $CaCO_3$, $SrCO_3$, $Y_2O_3$ and CuO at 860° C. for 12 hours. By annealing in air at various temperatures then quenching into liquid nitrogen, the normal state resistivity is observed to change as shown in FIG. 14. However, the zero-resistance $T_C$ does not change, remaining at just over 90K for anneals at 500, 700 and 820. This is uncharacteristic of the parent n=2 superconductor as shown in FIG. 12 which required anneals at an oxygen partial pressure less than that of air in order to optimise $T_C$ at just over 90K. The combined Pb- and Y-substitution therefore simplifies the processing requirements for n=2 material.

EXAMPLE 11 (n=3)

A sample of nominal composition $BiSrCaCu_3O_x$ was prepared from the carbonates of Sr and Ca, CuO and bismuth oxycarbonate by reacting at 820° C. for 9 hrs, then for 10 hrs at 850° C. then for 10 hrs at 860° C. followed by air-quenching from the furnace. The sample was then annealed in air at temperatures ranging between 400° C. and 800° C. and quenched from the furnace into liquid nitrogen. Four terminal electrical DC resistivity and the AC susceptibility was measured for each anneal temperature. FIG. 15A shows the resistivity curves obtained for this sample after each anneal. The resistivity drop which occurs around 110K is extrapolated to zero and the deduced zero resistance $T_C$ is seen to be maximised at 105K for anneals at about 400° C. The annealing behaviour is seen to be quite different from that of the n=2 material shown FIG. 15B.

This sample was pulverised, ground and investigated by XRD, SEM energy dispersive analysis of X-rays (EDX) and TEM electron diffraction. The EDX analyses indicated a high proportion (>70%) of particles with atomic ratios Bi:Sr:Ca:Cu of 2:2:2:3 though many of these particles showed Cu contents more like 2.8 to 2.9 indicating the occurrence of n=2 intergrowths in the n=3 material. Like the n=2 material, crystals of n=3 are platey and under TEM electron diffraction were found to exhibit a 5.4 Å×5.4 Å subcell in the basal plane with the same 19/4 times incommensurate superlattice structure in the b-direction. The diffraction patterns for the $[\overline{5}\overline{5}1]$ zone axis shown in FIGS. 16A, 16B, and 16C respectively can be indexed on a 5.4 Å×5.4 Å×74 Å cell suggesting a sub-cell c-axis of 37 Å with a superstructure which doubles the c-axis. XRD powder diffraction of this sample showed a broad basal reflection corresponding to a c-repeat of about 18 Å. This leads to the natural conclusion that $Bi_2Sr_2Ca_2Cu_3O_{10}$ is structurally related to $Bi_2Sr_2Ca_1Cu_2O_5$ by the insertion of an extra pair of Ca-CuO$_2$ sheets per unit sub-cell.

EXAMPLE 12 (n=3)

Samples of composition $Bi_{2.2-x}Pb_xCa_2Sr_2Cu_3O_{10+d}$ were prepared by reaction of the oxides of Bi and Cu and the nitrates of Pb, Ca and Sr in stoichiometric proportions for 36 hrs at 860° to 865° C. in air. The XRD pattern shown in FIG. 8b indicates nearly single phase pseudo-tetragonal material with lattice parameters a=5.410 Å and c=37.125 Å. Like the n=2 x=0.2 material, electron diffraction indicates a 4.5 times and a 7.3 times b-axis superlattice structure. The effect on resistivity curves of annealing in air at various temperatures is shown in FIG. 11b and the curve for the x=0 material is shown in the inset. The long resistive tail in the unsubstituted material is removed by Pb-substitution. The effect of annealing temperature in air on the zero resistance $T_C$ is shown in FIG. 10 by the diamond shaped points for x=0.35 and x=0.

The foregoing describes the invention including preferred forms and examples thereof. The preparation of derivative materials and forms other than sintered ceramic form, ie., thin films, thick films, single crystals, filaments and powders other than those specifically exemplified will be within the scope of those skilled in the art in view of the foregoing. The scope of the invention is defined in the following claims.

What is claimed is:

1. A metal oxide material which exhibits bulk superconductivity at a temperature of at least about 90K, said metal oxide material having the formula $B_bSr_2Ca_{1-x}R_xCu_2O_{8-d}$ wherein b is about 2.1, $0 < X \leq 0.1$, B is Bi or Bi partially replaced by Tl, Sr and Ca can be replaced in part by any alkali metal, alkali earth metal, or a combination thereof, R is Y or any rare earth element, and wherein d is fixed by, or at a level equivalent to that achieved by, annealing said metal oxide material at a temperature of at least 500° C. in oxygen at a pressure or partial pressure not greater than the partial pressure of oxygen in air.

2. A metal oxide material according to claim 1 wherein R is Y.

3. A metal oxide material according to claim 2 having the formula

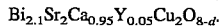

$Bi_{2.1}Sr_2Ca_{0.95}Y_{0.05}Cu_2O_{8-d}$.

4. A metal oxide material according to claim 2 having the formula

$Bi_{2.1}Sr_2Ca_{0.9}Y_{0.1}Cu_2O_{8-d}$.

5. A metal oxide material according to claim 1 wherein d is fixed by annealing said metal oxide material and after annealing said metal oxide material is quenched rapidly to maintain the value of d substantially unchanged.

6. A metal oxide material according to claim 2 wherein d is fixed by annealing said metal oxide material and after annealing said metal oxide material is quenched rapidly to maintain the value of d substantially unchanged.

7. A metal oxide material according to claim 5 wherein the annealing of said metal oxide material is performed under time and temperature conditions that are controlled to adjust the oxygen stoichiometry of the metal oxide material to improve the superconducting transition temperature ($T_c$) thereof.

8. A metal oxide material according to claim 5 wherein the annealing of said metal oxide material is performed under time and temperature conditions that are controlled to adjust the oxygen stoichiometry of the metal oxide material to improve the current carrying capacity ($J_c$) thereof.

9. A metal oxide material which exhibits bulk superconductivity at a temperature of at least 90K, said material having the composition $$B_{2.1}Sr_2Ca_{1-x}R_xCu_2O_{8-d}$$

wherein $0 < x \leq 0.15$,

B is Bi or Bi partially replaced by Tl,

Sr and Ca can be replaced in part by any alkali metal, alkali earth metal, or a combination thereof, R is Y or any rare earth element, and wherein d is fixed by, or at a level equivalent to that achieved by, annealing said metal oxide material at a temperature of at least 500° C. in oxygen at a pressure or partial pressure not greater than the partial pressure of oxygen in air.

10. A metal oxide material according to claim 9, wherein R is Y.

11. A metal oxide material which exhibits bulk superconductivity at a temperature of at least 90K, said material having the composition $$B_{2-y}Pb_ySr_2Ca_{1-x}R_xCu_2O_{8-d}$$

where $0 < x \leq 0.15$ and $0 < y \leq 0.4$

B is Bi, Tl, or Bi partially replaced by Tl,

Sr and Ca can be replaced in part by any alkali metal, alkali earth metal, or a combination thereof, R is Y or any rare earth element, and d is fixed by annealing said metal oxide material at a temperature of at least 500° C. in oxygen at a pressure or partial pressure not greater than the partial pressure of oxygen in air.

12. A metal oxide material according to claim 11 wherein B is Bi.

13. A metal oxide material according to claim 11, wherein R is Y.

14. A metal oxide material according to claim 13 wherein B is Bi.

15. A metal oxide material according to claim 14 having the formula $$Bi_{1.9}Pb_{0.35}Sr_2Y_{0.1}Cu_2O_{8-d}.$$

16. A metal oxide material according to claim 12 wherein d is fixed by annealing said metal oxide material and after annealing said metal oxide material is quenched rapidly to maintain the value of d substantially unchanged.

17. A metal oxide material according to claim 11 wherein after annealing, said metal oxide material is quenched rapidly to maintain the value of d substantially unchanged.

18. A metal oxide material according to claim 13 wherein after annealing, said metal oxide material is quenched rapidly to maintain the value of d substantially unchanged.

* * * * *